United States Patent
Ito et al.

(10) Patent No.: US 8,119,020 B2
(45) Date of Patent: Feb. 21, 2012

(54) METHOD FOR MANUFACTURING ELECTRONIC DEVICE

(75) Inventors: Shoko Ito, Kanagawa-ken (JP); Makiko Katano, Kanagawa-ken (JP); Atsuko Kawasaki, Kanagawa-ken (JP); Masahiro Kiyotoshi, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 957 days.

(21) Appl. No.: 11/826,922

(22) Filed: Jul. 19, 2007

(65) Prior Publication Data
US 2008/0023442 A1    Jan. 31, 2008

(30) Foreign Application Priority Data
Jul. 20, 2006 (JP) .................................. 2006-198481

(51) Int. Cl.
*B44C 1/22* (2006.01)
(52) U.S. Cl. ............... 216/58; 414/217; 414/222.01; 414/935; 118/719; 156/345.31
(58) Field of Classification Search .............. 216/58; 414/217, 222.01, 935; 118/719; 156/345.31
See application file for complete search history.

(56) References Cited

U.S. PATENT DOCUMENTS

| | | | |
|---|---|---|---|
| 5,885,654 A * | 3/1999 | Hagiwara et al. ............. | 427/226 |
| 5,924,833 A * | 7/1999 | Conboy et al. ................ | 414/217 |
| 6,547,953 B2 | 4/2003 | Suzuki et al. | |
| 6,875,282 B2 | 4/2005 | Tanaka et al. | |
| 6,899,145 B2 | 5/2005 | Aggarwal | |
| 2004/0105738 A1 * | 6/2004 | Ahn et al. ................. | 414/222.01 |

FOREIGN PATENT DOCUMENTS

| | | |
|---|---|---|
| JP | 11-125914 | 5/1999 |
| JP | 2000-174109 | 6/2000 |
| JP | 2002-261159 | 9/2002 |
| JP | 2003-110013 | 4/2003 |
| JP | 2006-5072 | 1/2006 |

OTHER PUBLICATIONS

Kawasaki, A. et al., "Local Clean Robot-Transport Plant and Robot-Transport Manufacturing Method," U.S. Appl. No. 11/797,528, filed May 4, 2007.
Notification of Reason(s) for Refusal issued by the Japanese Patent Office on Apr. 5, 2011, for Japanese Patent Application No. 2006-198481, and English-language translation thereof.

* cited by examiner

*Primary Examiner* — Nadine G Norton
*Assistant Examiner* — Maki Angadi
(74) *Attorney, Agent, or Firm* — Finnegan, Henderson, Farabow, Garrett & Dunner, L.L.P.

(57) ABSTRACT

A method for manufacturing an electronic device using a closed-type transport container, includes: controlling relative humidity inside the closed-type transport container to be lower than ambient relative humidity outside the closed-type transport container on a particular interprocess transport path in which an intermediate product stored in the closed-type transport container is transported from a first manufacturing process to a second manufacturing process. The first manufacturing process allows basic compounds containing nitrogen atoms to be released from the intermediate product. The second manufacturing process is susceptible to degradation due to contamination by the basic compounds.

18 Claims, 29 Drawing Sheets

EXHAUST GAS    INTRODUCE GAS

METHOD FOR MANUFACTURING ELECTRONIC DEVICE

CROSS-REFERENCE TO RELATED APPLICATIONS

This application is based upon and claims the benefit of priority from the prior Japanese Patent Application No. 2006-198481, filed on Jul. 20, 2006; the entire contents of which are incorporated herein by reference.

BACKGROUND OF THE INVENTION

1. Field of the Invention

This invention relates to a method for manufacturing an electronic device using a closed-type transport container.

2. Background Art

In the process for manufacturing a semiconductor device, basic compounds containing nitrogen atoms such as ammonia ($NH_3$) and amines including primary to tertiary amines present in the manufacturing environment are known to cause dimensional variation by reaction with chemically-amplified resist. Hence the apparatus for the photolithography process using chemically-amplified resist is strictly controlled so as not to be contaminated with $NH_3$ and amines present in the manufacturing environment. For example, a method is proposed for storing semiconductor substrates without varying the sensitivity of chemically-amplified resist applied thereto by controlling the ammonia concentration in the storage environment to a prescribed concentration (see, e.g., JP 11-125914A (1999)).

On the other hand, $NH_3$ may occur not only from the manufacturing environment, but also from semiconductor substrates. For example, semiconductor substrates may be processed by dry etching using $NH_3$ as an etching gas or chemical vapor deposition (CVD) of silicon nitride film. In these cases, $NH_3$ adsorbed on the semiconductor substrate is introduced into the apparatus for the subsequent processes. Furthermore, polysilazane (PSZ) film formed by application of silazane perhydride contains unstable silicon-nitrogen (Si—N) bonds in the film, which are hydrolyzed during storage to release $NH_3$. If such substrates producing $NH_3$ are stored in a highly hermetic storage container like the Front Opening Unified Pod (FOUP), $NH_3$ is accumulated in the container. For this reason, before lithography or other processes requiring $NH_3$ contamination control, the container needs to be replaced by a container not contaminated with $NH_3$ for preventing contamination. However, container replacement unfortunately results in decreasing the production efficiency and increasing the manufacturing cost, such as increasing the number of processes, increasing the number of storage containers needed, and increasing the space for storing containers.

SUMMARY OF THE INVENTION

According to an aspect of the invention, there is provided a method for manufacturing an electronic device using a closed-type transport container, including; controlling relative humidity inside the closed-type transport container to be lower than ambient relative humidity outside the closed-type transport container on a particular interprocess transport path in which an intermediate product stored in the closed-type transport container is transported from a first manufacturing process to a second manufacturing process, the first manufacturing process allowing basic compounds containing nitrogen atoms to be released from the intermediate product, and the second manufacturing process being susceptible to degradation due to contamination by the basic compounds.

According to another aspect of the invention, there is provided a method for manufacturing an electronic device using a closed-type transport container, including: keeping a work in an atmosphere between a first manufacturing process and a second manufacturing process, a relative humidity of the atmosphere being 30% or less, and the first manufacturing process allowing compounds containing nitrogen and hydrogen to be released from the work.

BRIEF DESCRIPTION OF THE DRAWINGS

FIG. 10 shows an example humidity control for the closed-type transport container according to the embodiment of the invention.

DETAILED DESCRIPTION OF THE INVENTION

Figure 1A:
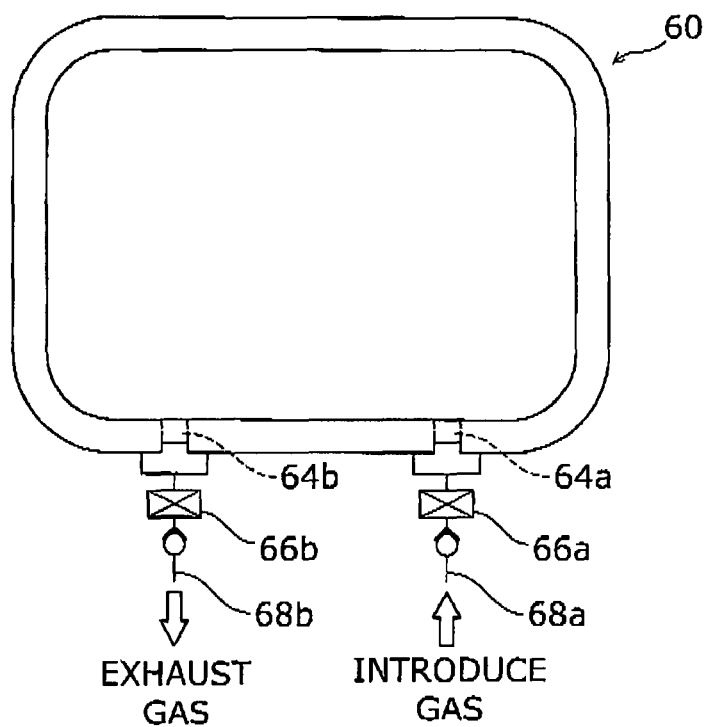
FIG. 1A is a front view of a closed-type transport container according to an embodiment of the invention.

An embodiment of the invention will now be described with reference to the drawings. In the following description of the figures, like or similar elements are marked with like or similar reference numerals. However, the figures are schematic. It should be noted that the relation of thickness to planar dimension and the ratio of thickness between various layers may be different from reality. Therefore the specific thickness or dimension should be determined by taking the following description into consideration. It is also understood that the dimensional relationship and/or ratio may be varied between some of the figures.

The embodiment described herein is illustrated with reference to a method for manufacturing a semiconductor device (semiconductor memory device). However, it is understood that the invention is applicable to robot-transport (automatic transport) manufacturing methods in technical fields requiring cleanliness, such as manufacturing methods for liquid crystal devices, magnetic recording media, optical recording media, thin-film magnetic heads, and superconducting devices.

A FOUP serves as a closed-type transport container 60 used in the method for manufacturing an electronic device according to the embodiment of the invention. The "FOUP" is a transport container for 300-mm wafers (works), which is a closed pod capable of maintaining cleanliness, compliant with SEMI (Semiconductor Equipment and Materials Institute) standards. As shown in FIG. 1A, the closed-type transport container 60 has breathing filters 64a, 64b at the bottom of the container body 61. By opening/closing the valves 66a, 66b, inert gas such as nitrogen ($N_2$) serving as purge gas can be introduced into or exhausted from the closed-type transport container 60 through the breathing filters 64a, 64b. The purge gas is supplied from a gas supply system (not shown) through pipings 68a, 68b. After the valves 66a, 66b are opened to replace the inside of the closed-type transport container 60 with the purge gas, the valves 66a, 66b are closed, and the closed-type transport container 60 is transported. The valves 66a, 66b are placed at a plurality of locations on the path along which the closed-type transport container 60 is transported. The outlet/inlet of the valves 66a, 66b are connected to the breathing filters 64a, 64b by the operation of a human operator, or under an instruction of a control server (not shown) managing the manufacturing of semiconductor devices.

Figure 1B:
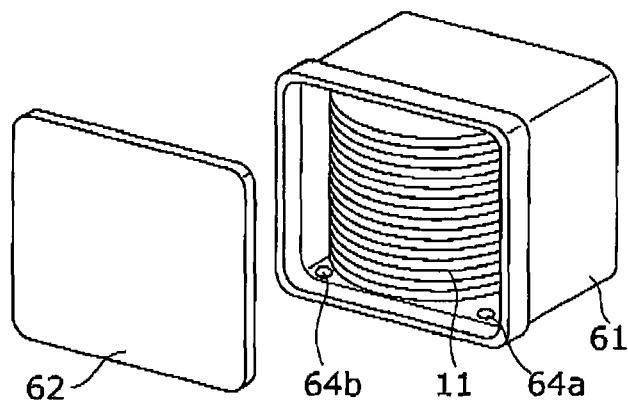
FIG. 1B is a perspective view thereof where its front-opening lid is opened.
Figure 1C:
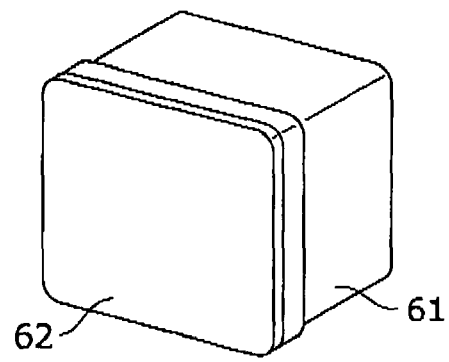
FIG. 1C is a perspective view thereof where its front-opening lid is closed.

FIG. 1B shows the closed-type transport container where its front-opening lid 62 is opened, and 24 wafers (semiconductor substrates) 11 in a lot, for example, are stored as works in the container body 61 using grooves (slots) cut inside the container body 61. On the other hand, FIG. 1C shows the closed state of the closed-type transport container where its front-opening lid 62 is closed.

Figure 2:
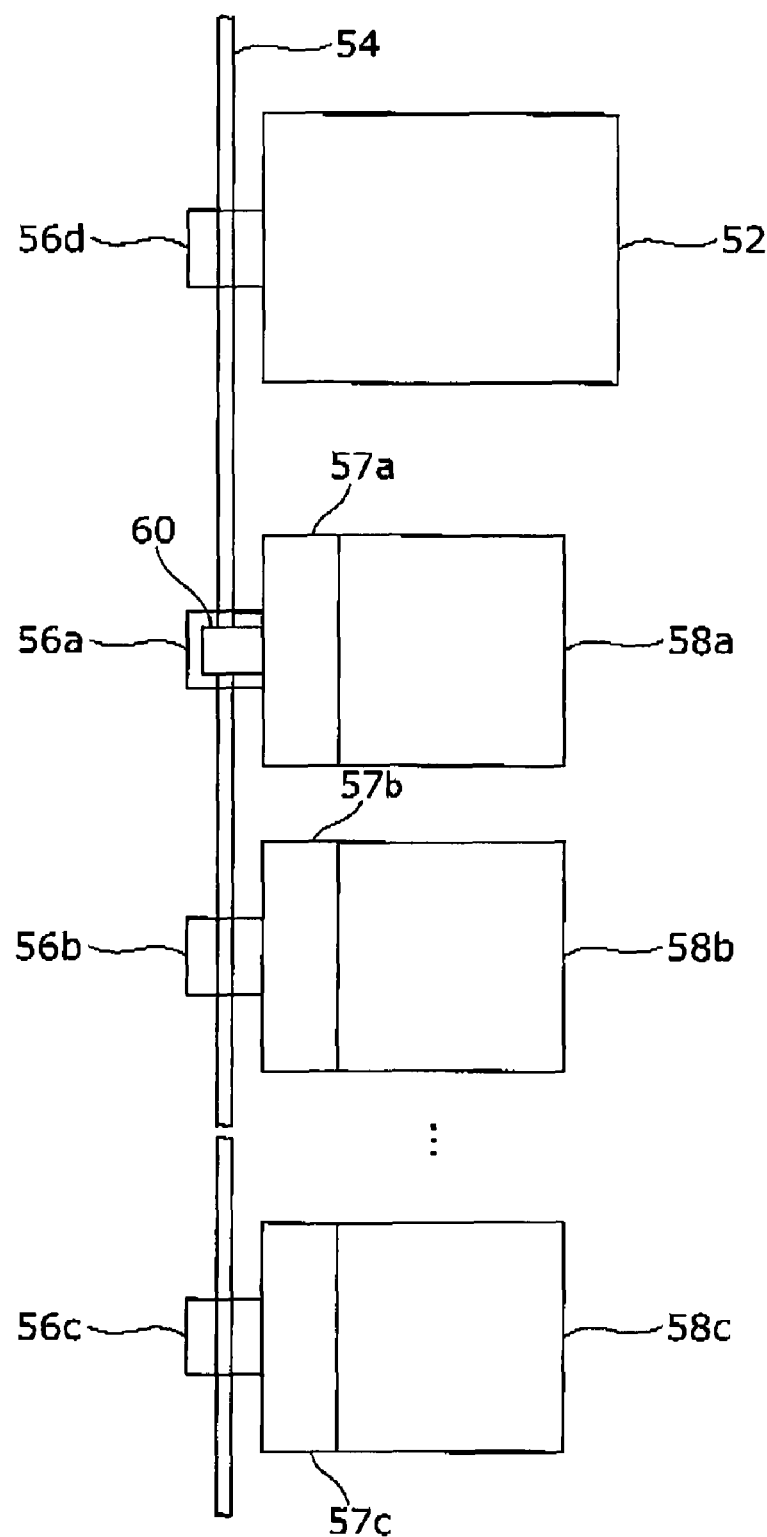
FIG. 2 schematically shows an example manufacturing facility used for describing the embodiment of the invention.

As shown in FIG. 2, a manufacturing facility for manufacturing a semiconductor device as an electronic device according to the embodiment of the invention comprises a plurality of manufacturing apparatuses 58a, 58b, . . . , 58c, and a cabinet 52 capable of storing a plurality of closed-type transport containers 60 that store and transport intermediate products of semiconductor devices processed by manufacturing processes along a plurality of interprocess transport paths defined among the plurality of manufacturing apparatuses 58a-58c in accordance with the flow of the manufacturing processes of industrial products.

The "interprocess transport path" used herein refers to a logical transport path defined among a plurality of processes arranged in time series. Hence actual mechanical (physical) transport paths may partially or entirely overlap each other because in some cases (situations), the same manufacturing apparatus is used in a plurality of different processes.

The manufacturing facility further comprises a transport rail 54 where the closed-type transport containers storing intermediate products of the semiconductor devices can be robot-transported (automatically transported) along the interprocess transport paths defined among the manufacturing apparatuses 58a-58c and along the transport paths between the cabinet 52 and the manufacturing apparatuses 58a-58c. The manufacturing apparatuses 58a-58c are connected to the transport rail 54 through load ports 56a, 56b, . . . , 56c provided in transfer chambers 57a, 57b, . . . , 57c, respectively. The cabinet 52 is connected to the transport rail 54 through a load port 56d.

The manufacturing apparatuses 58a-58c shown in FIG. 2 include a washer for washing the surface of a semiconductor wafer, which is an intermediate product, or removing resist therefrom with acid solution or pure water, a gate oxidation (thermal oxidation) apparatus for forming thin silicon oxide film ($SiO_2$ film) such as tunnel oxide film, a polysilicon reduced-pressure chemical vapor deposition (LPCVD) apparatus for depositing polysilicon film, a nitride film LPCVD apparatus for depositing silicon nitride film ($Si_3N_4$ film), a spin coater (spinner) for spin coating photoresist film, a stepper (exposure apparatus) for patterning photoresist film by exposure thereof using photolithography to transfer a desired pattern, a developing apparatus for developing exposed photoresist film, a reactive ion etching (RIE) apparatus for etching thin film formed in or on the surface of an intermediate product (semiconductor wafer), a coater for applying a solution containing silazane perhydride or polysilazane, a silazane perhydride baking apparatus for heat treating the applied silazane perhydride to form PSZ film, a PSZ film oxidation apparatus for oxidizing PSZ film, a chemical mechanical polishing (CMP) apparatus for polishing and planarizing the surface of an intermediate product (semiconductor wafer), an interelectrode insulating film LPCVD apparatus for depositing interelectrode insulating film such as $Si_3N_4$ film, strontium oxide (SrO) film, aluminum oxide ($Al_2O_3$) film, magnesium oxide (MgO) film, yttrium oxide ($Y_2O_3$) film, hafnium oxide ($HfO_2$) film, zirconium oxide ($ZrO_2$) film, tantalum oxide ($Ta_2O_5$) film, bismuth oxide ($Bi_2O_3$) film, and hafnium aluminate (HfAlO) film, an ion implantation apparatus for implanting desired dopant ions into an intermediate product (semiconductor wafer), an annealing furnace for heat treating an intermediate product (semiconductor wafer) after ion implantation to activate implanted ions, an interlayer insulating film CVD apparatus for depositing interlayer insulating film such as $SiO_2$ film, phosphosilicate glass (PSG) film, borosilicate glass (BSG) film, borophosphosilicate glass (BPSG) film, $Si_3N_4$ film, and carbon-doped silicon oxide (SiOC), an interlayer insulating film coater for applying low dielectric constant insulating film made of inorganic spin-on-glass (SOG) or other inorganic material or organic SOG to form interlayer insulating film, and a dry etching (DE) apparatus for etching low dielectric constant organic insulating film.

The spinner, the stepper, and the developing apparatus, which are related to photolithography, may be streamlined into a continuous process line having a clean area for internal transport, and a common load port may be provided along this process line to form an integrated manufacturing apparatus. Similarly, the silazane perhydride coater, the silazane perhydride baking apparatus, and the PSZ film oxidation apparatus may be streamlined into a continuous process line having a clean area for internal transport, and a common load port may be provided along this process line to form an integrated manufacturing apparatus.

It is understood that the manufacturing facility may include various semiconductor manufacturing apparatuses such as a wet etching apparatus for etching the surface of an intermediate product (semiconductor wafer) with etching liquid, a dopant diffusion apparatus for diffusing dopant elements from vapor phase into an intermediate product (semiconductor wafer), a heat treatment apparatus for reflowing (melting) PSG film, BSG film, or BPSG film, a heat treatment apparatus for densifying CVD oxide film, a heat treatment apparatus for forming silicide film, a sputtering apparatus for depositing a metal interconnect layer, a vacuum evaporation apparatus, a plating apparatus for further forming a metal interconnect layer by plating, a dicer, and a bonder for connecting the electrode of a diced semiconductor device chip to a lead frame.

The manufacturing facility may also include various inspection and measurement apparatuses such as an interferometric thickness gauge, ellipsometer, contact thickness gauge, microscope, and resistance measurement apparatus.

Figure 3A:
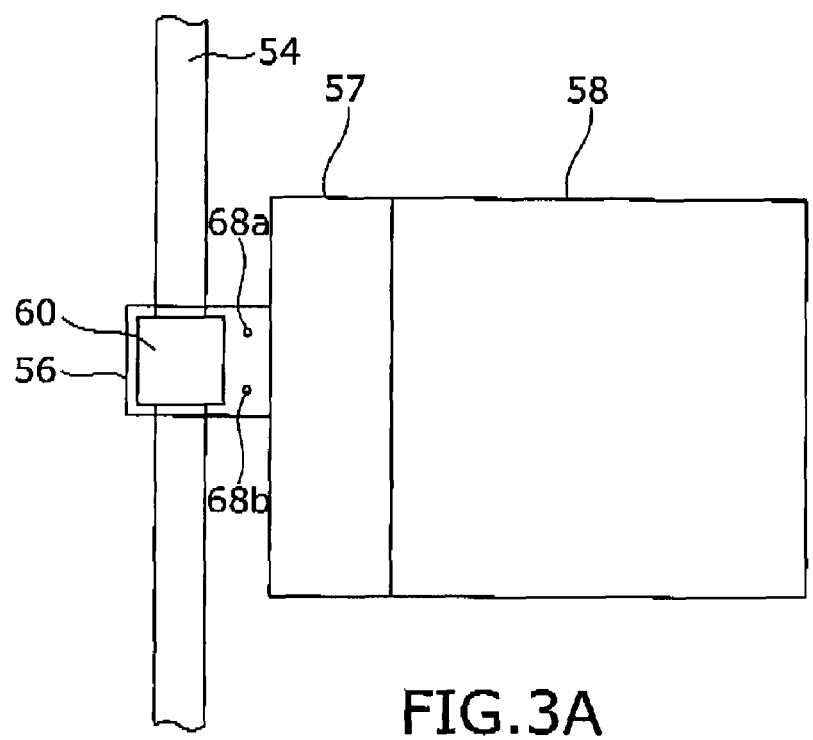
FIG. 3A is a plan view schematically illustrating the basic configuration of a manufacturing facility according to the embodiment of the invention with focus on a particular semiconductor manufacturing apparatus.
Figure 3B:
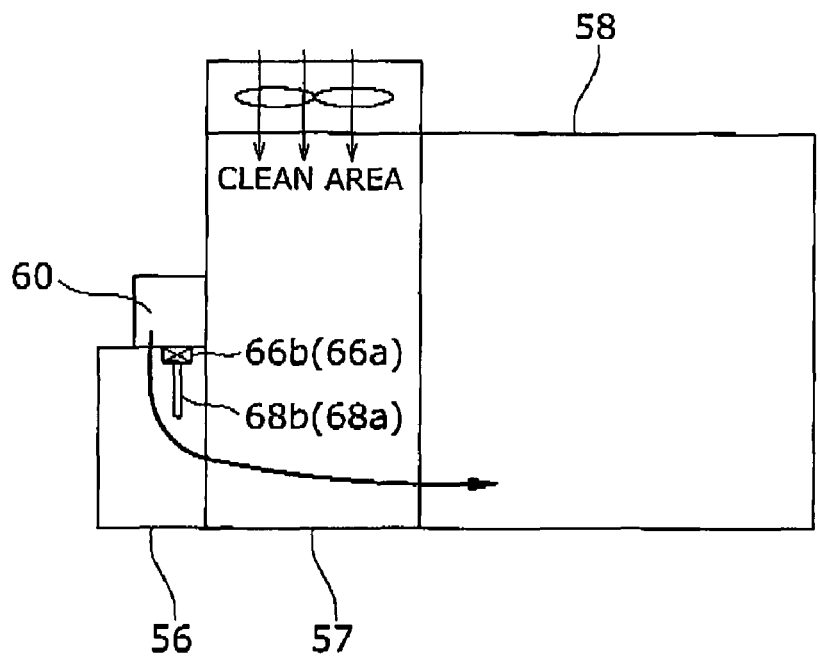
FIG. 3B is a corresponding side view.

In FIG. 3, a particular set of one of the manufacturing apparatuses 58a-58c, transfer chambers 57a-57c, and load ports 56a-56c shown in FIG. 1 is selected as a representative and generically shown as a manufacturing apparatus 58, a transfer chamber 57, and a load port 56. As shown in FIG. 3A, the closed-type transport container 60 is transported via the transport rail 54 onto the load port 56 of the manufacturing apparatus 58. As shown in FIG. 3B, the lid 62 (not shown) of the closed-type transport container 60 is automatically opened in the load port 56. Intermediate products (semiconductor wafers) are transferred from the closed-type transport container 60 to the manufacturing apparatus 58 through the transfer chamber 57 locally cleaned as a clean area, and undergo processing of a prescribed process. Upon completion of the processing of the process, the resulting intermediate products are transferred to the load port 56 through the transfer chamber 57. Inside the load port 56, the intermediate products are automatically stored in the closed-type transport container 60. The lid 62 of the closed-type transport container 60 is automatically closed. Then the closed-type transport container 60 is transported via the transport rail 54 to the manufacturing apparatus of the next process. If the manufacturing apparatus of the next process is processing another lot or unavailable because of maintenance, then the closed-type transport container 60 waits on the transport rail 54 immediately in front of the manufacturing apparatus of the next process. If it is determined that the manufacturing apparatus of the next process is unavailable for a long time, the closed-type transport container 60 is transported to the load port 56d, and stored in the cabinet 52 through the load port 56d.

The load port 56 is provided with pipings 68a, 68b for introducing and exhausting inert gas such as $N_2$. For example, after intermediate products that have completed a process are stored in the closed-type transport container 60, the valves 66a, 66b are connected to the breathing filters 64a, 64b of the closed-type transport container 60. The inside of the closed-type transport container 60 can be purged with inert gas so that it can be controlled to a lower relative humidity than the ambient relative humidity of the clean room. The pipings 68a, 68b for introducing and exhausting inert gas may be provided on the cabinet 52 and/or the load port 56d to control the humidity inside the closed-type transport container 60 during storing the closed-type transport container 60. Pipings for introducing and exhausting inert gas may be provided along the transport rail 54 to control the humidity inside the closed-type transport container 60 during transport.

Figure 4:
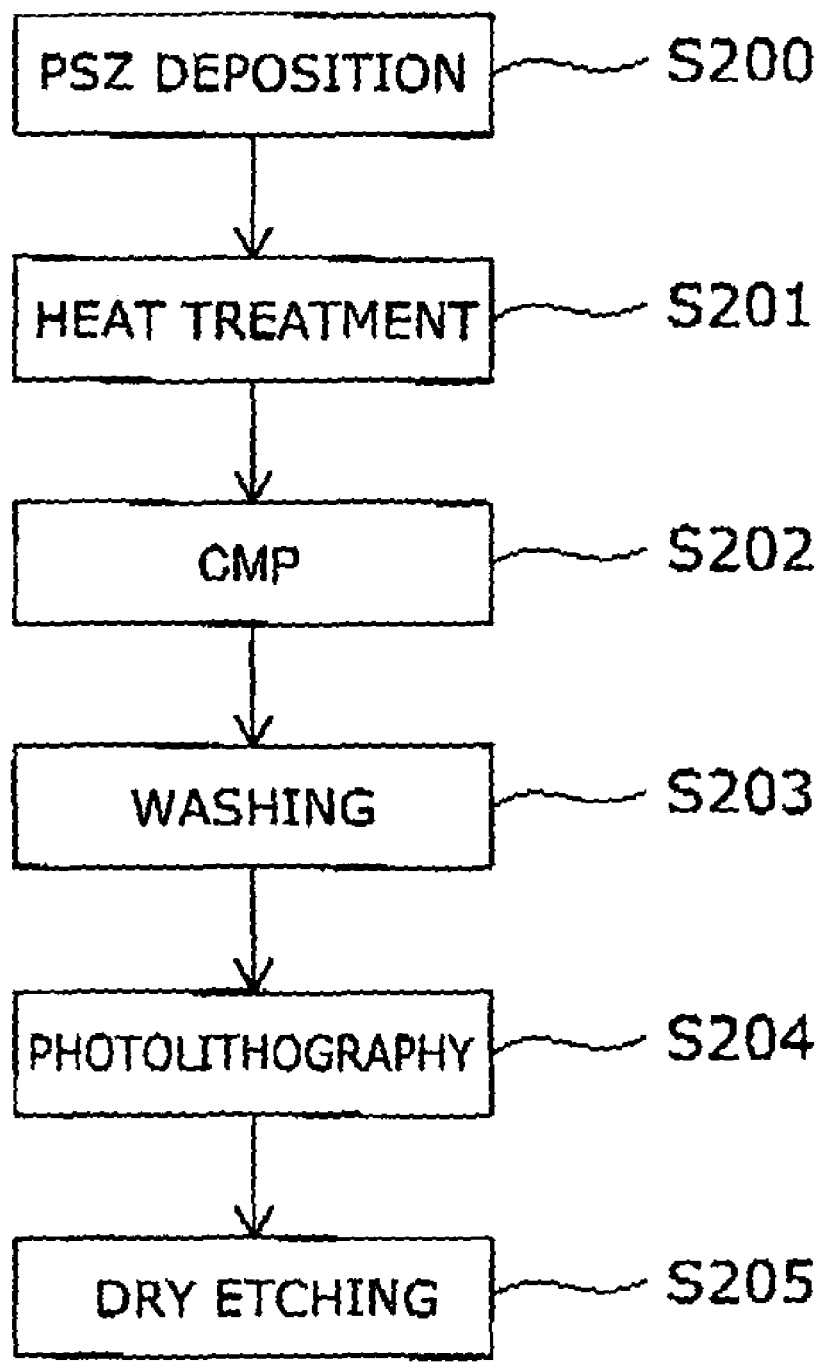
FIG. 4 is a cross-sectional process diagram according to the embodiment of the invention.

Next, the process flow shown in FIG. 4 is used to describe a method for manufacturing a semiconductor device according to the embodiment of the invention with regard to contamination of the closed-type transport container 60 with basic compounds containing nitrogen atoms such as $NH_3$ caused by PSZ film.

The shallow trench isolation (STI) structure is widely used for device isolation in semiconductor devices. In this structure, a groove is formed in the device isolation region of the semiconductor substrate, and $SiO_2$ film or the like serving as device isolation insulating film is buried in this groove. With the downscaling of semiconductor devices, the aspect ratio of the groove increases, which makes it difficult to fill the STI groove with the conventional ozone ($O_3$)/tetraethylorthosilicate (TEOS) CVD $SiO_2$ film or high-density plasma (HDP) CVD $SiO_2$ film without generating voids and seams.

Thus, in a proposed method for manufacturing semiconductor devices from the 100-nm generation onward, coating-type solution SOG (spin-on-glass) is used to fill the STI groove with device isolation insulating film. In particular, among SOG-based chemicals, a silazane perhydride polymer solution having relatively small volume shrinkage has recently drawn attention.

For example, in step S200, a silazane perhydride polymer solution is applied in the groove provided in a semiconductor wafer (substrate), which is an "intermediate product", using a coater. In step S201, the semiconductor wafer coated with silazane perhydride is heat treated by a silazane perhydride baking apparatus to form PSZ film. In step S202, the semiconductor wafer with PSZ film formed thereon is planarized by a CMP apparatus to expose the semiconductor wafer surface, thereby burying the PSZ film in the groove. In step S203, the planarized semiconductor wafer is washed by a washer. In step S204, a resist pattern is formed on the surface of the semiconductor wafer by photolithography using a spinner, an exposure apparatus, and a developing apparatus. Finally, in step S205, the resist pattern is used as a mask to process the semiconductor wafer by dry etching using a RIE apparatus.

Figure 5:
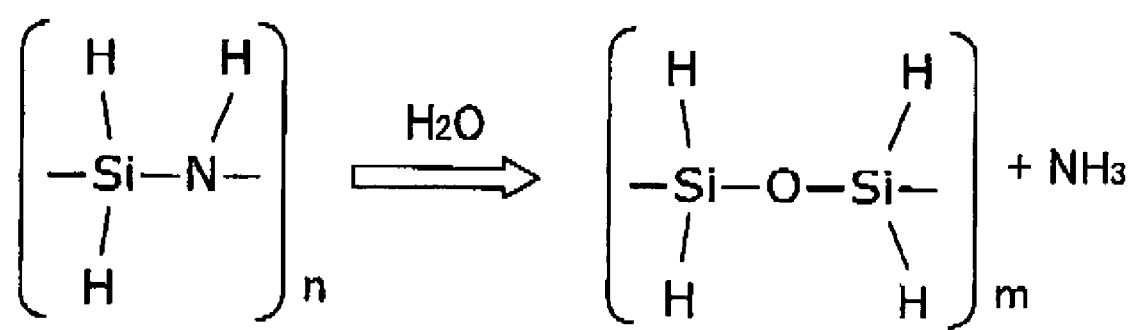
FIG. 5 shows an example hydrolysis reaction of silazane perhydride used for describing the embodiment of the invention.

Intermediate products are stored in the closed-type transport container and transported along the interprocess transport paths defined among the manufacturing apparatuses for the associated processes. As shown in FIG. 5, silazane perhydride is a substance having a structure of —$(SiH_2$—NH)$_n$—. Unstable Si—N bonds present in PSZ film undergo hydrolysis reaction with ambient water ($H_2O$). Thus the Si—N bond is broken, thereby forming an Si—O bond and generating $NH_3$. Silazane structures such as Si—H, N—H, and Si—N remain in the PSZ film after heat treatment, and hence they are hydrolyzed to generate $NH_3$.

Furthermore, the closed-type transport container 60 is made of polycarbonate (PC) or polybutylene terephthalate (PBT), and hence $NH_3$ penetrates the material of the closed-type transport container. That is, as described below, when a semiconductor wafer with exposed silazane perhydride coating or with PSZ film formed by baking it is stored in the closed-type transport container, $NH_3$ generated from the silazane perhydride coating or the PSZ film penetrates the material of the closed-type transport container and causes contamination.

Hence, when the semiconductor wafer with exposed PSZ film is washed in step S203 and then transported to the photolithography process using the closed-type transport container, the semiconductor wafer is contaminated with $NH_3$ released from the inner wall of the closed-type transport container in addition to that from the PSZ film.

Figure 6:
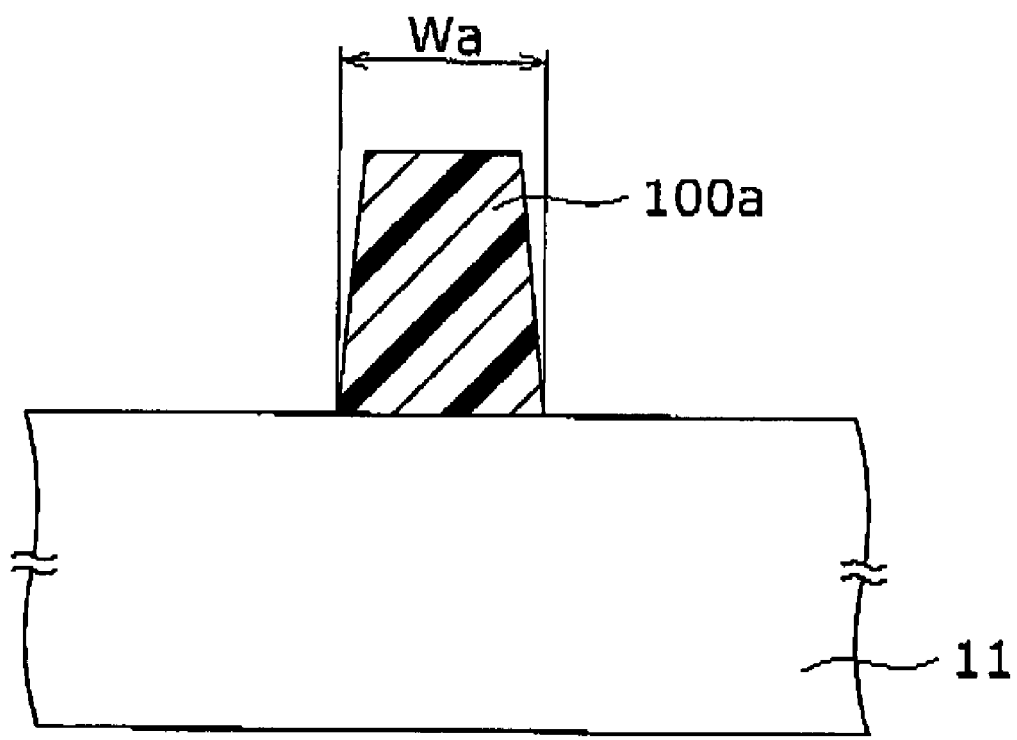
FIG. 6 is a schematic cross-sectional view of a pattern of uncontaminated photoresist film used for describing the embodiment of the invention.
Figure 7:
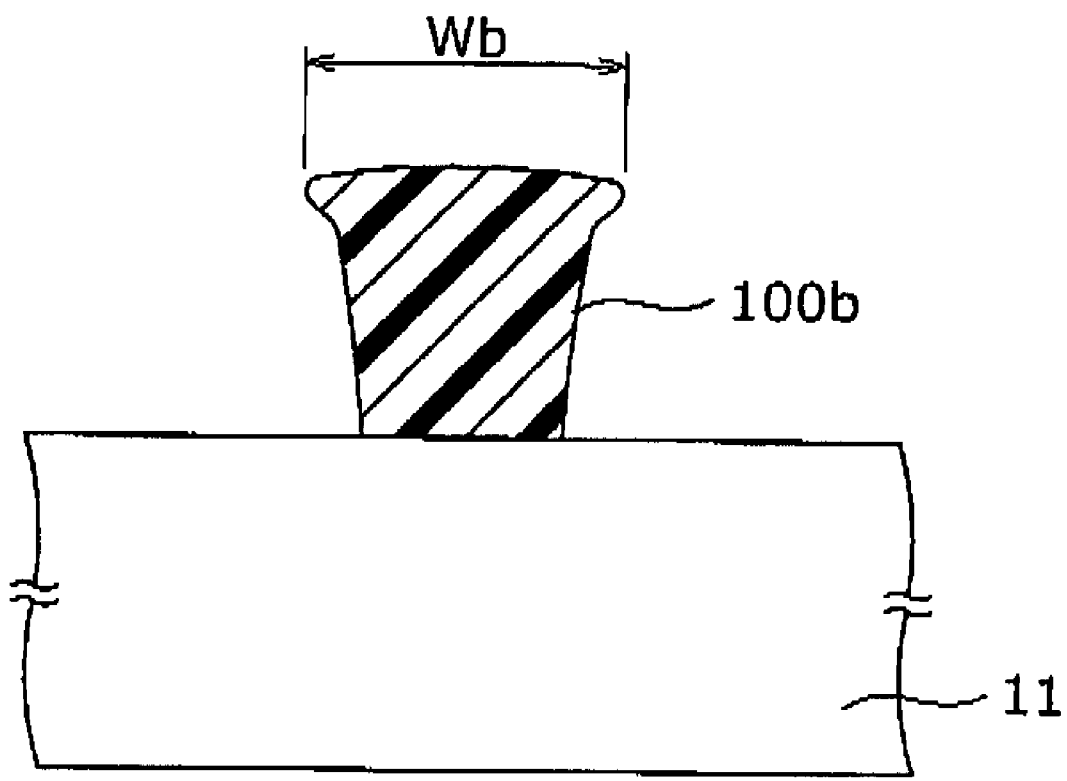
FIG. 7 is a schematic cross-sectional view showing a defective shape of a pattern of photoresist film due to ammonia contamination used for describing the embodiment of the invention.

Highly sensitive photoresist such as chemically-amplified photoresist reacts with basic compounds containing nitrogen atoms such as $NH_3$ and amines to cause adhesion failure and patterning distortion, thereby degrading the performance of the photolithography process. For example, as shown in FIGS. 6 and 7, if the photoresist film is processed into a thin line-and-space pattern followed by reacting with $NH_3$, a shape called "T-top" occurs, resulting in a resist pattern 100b having a defective shape as compared with a resist pattern 100a in the uncontaminated (normal) condition. Consequently, the line width Wb of the resist pattern 100b becomes larger than the line width Wa of the resist pattern 100a, causing dimensional variation. In particular, the resist for exposure by an argon fluoride (ArF) excimer laser with a wavelength $\lambda$ of 193 nm is sensitive to basic compounds containing nitrogen atoms and undergoes significant dimensional variation.

Thus the semiconductor wafer is contaminated with $NH_3$ during transport in the closed-type transport container, and the resist pattern formed by photolithography in step S204 undergoes dimensional variation. This causes variation in the processing dimension of dry etching in step S205 and decreases the processing yield.

Figure 8:
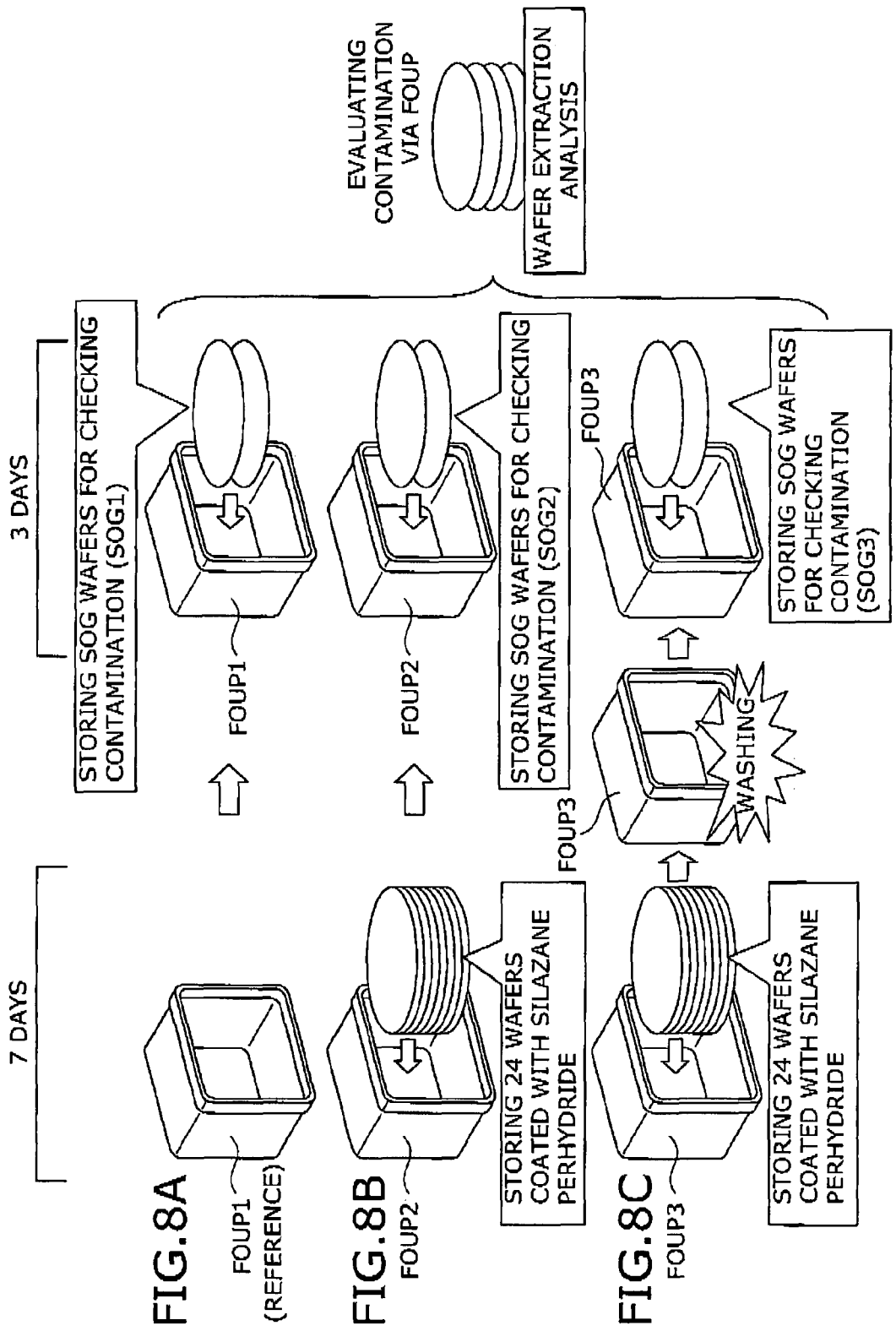
FIG. 8 schematically shows a procedure of inspecting contamination of closed-type transport containers caused by polysilazane (PSZ) film using a closed-type transport container (FOUP) 1 shown in FIG. 8A, a closed-type transport container (FOUP) 2 shown in FIG. 8B, and a closed-type transport container (FOUP) 3 shown in FIG. 8C.

As shown in FIGS. 8A, 8B, and 8C, FOUP1, FOUP2, and FOUP3 were prepared as the closed-type transport containers, and contamination of the closed-type transport containers by PSZ film was examined in the following procedure. FOUP1 shown in FIG. 8A is a closed-type transport container for preparing a standard sample (reference).

(a) First, for preparing "intermediate products", 48 semiconductor wafers (Si wafers) measuring 300 mm in diameter were each coated with a silazane perhydride polymer solution to a thickness of 600 nm by spin coating. Then the silazane perhydride coating was baked at 150° C. for three minutes. Thus PSZ film was formed on each of the 48 semiconductor wafers.

(b) As shown in FIG. 8A, FOUP1 for preparing a reference was left empty and retained in the clean room for seven days. On the other hand, the semiconductor wafers with PSZ film formed thereon as described above were divided into two sets of 24 semiconductor wafers, and each set was stored in FOUP2 and FOUP3 as shown in FIGS. 8B and 8C, respectively, so that the wafers are inserted into slots 1 to 24, and retained for seven days.

(c) Then, as shown in FIG. 8A, wafers (SOG1) with SOG film other than PSZ film (hereinafter referred to as "non-silazane SOG film") for checking contamination were stored in FOUP1 for preparing a reference and retained for three days. On the other hand, as shown in FIG. 8B, the 24 semiconductor wafers with PSZ film formed thereon were removed from FOUP2, which was directly used to store wafers (SOG2) with non-silazane SOG film for checking contamination and retained for three days. In contrast, as shown in FIG. 8C, the 24 semiconductor wafers with PSZ film formed thereon were removed from FOUP3, which was then washed in an automatic container washer. After the washing, as shown in FIG. 8C, wafers (SOG3) with non-silazane SOG film for checking contamination were stored in FOUP3 and retained for three days.

(d) Then $NH_3$ adsorbed on the wafers SOG1, SOG2, and SOG3 with non-silazane SOG film for checking contamination was determined by pure water extraction and ion chromatography.

Figure 9:
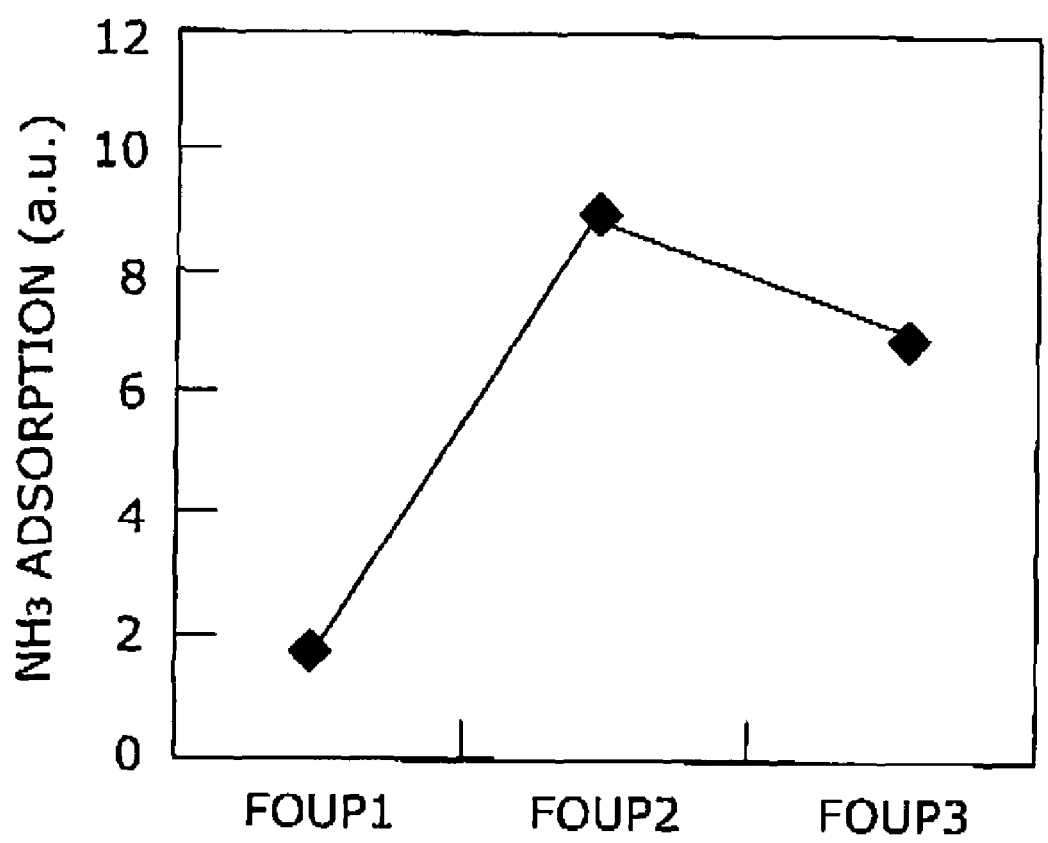
FIG. 9 shows an example result of inspecting ammonia contamination by using the closed-type transport containers shown in FIG. 8.

The result of the above procedure (a)-(d) for examining the contamination of the closed-type transport containers caused by silazane perhydride is shown in FIG. 9.

As shown in FIG. 9, the amount of $NH_3$ adsorbed on SOG2 stored in FOUP2 is about four times larger than that on the reference SOG1 stored in FOUP1. The amount of $NH_3$ adsorbed on SOG3 stored in FOUP3 is smaller than that on SOG2 by the effect of washing, but about three times or more that on the reference SOG1.

As seen in the result of contamination due to adsorption on the non-silazane SOG film formed on the surface of the semiconductor wafer, $NH_3$ contamination was detected not only from SOG2 stored in FOUP2 with $NH_3$ adsorbed on its inner wall, but also from SOG3 stored in the washed FOUP3. This indicates that, even if $NH_3$ adsorbed on the inner wall surface of the closed-type transport container was washed away, $NH_3$ remains trapped in the material of the closed-type transport container and is gradually released into the closed-type transport container. Consequently, $NH_3$ trapped in the material of the closed-type transport container is adsorbed on the non-silazane SOG film formed on the surface of the stored semiconductor wafer to cause contamination. Hence, once the closed-type transport container is contaminated with $NH_3$, the semiconductor wafer stored therein is contaminated with $NH_3$ released again from the material of the closed-type transport container.

For preventing $NH_3$ contamination in the photolithography process, it is possible to use a dedicated closed-type transport container free from $NH_3$ contamination along the interprocess transport path between the washing process of step S203 and the photolithography process of step S204. However, in this case, PSZ film is exposed on the surface of the intermediate product after the washing process, and hence the inner wall of the closed-type transport container is contaminated during transport. For this reason, the closed-type transport container needs to be replaced frequently, thereby decreasing the production efficiency and increasing the manufacturing cost. Furthermore, the intermediate produce during transport is also contaminated with $NH_3$ released from the PSZ film. Therefore the foregoing cannot be a fundamental countermeasure to $NH_3$ contamination.

In the embodiment of the invention, as shown in FIG. 1, the humidity inside the closed-type transport container 60 can be made lower than the ambient humidity such as in the transfer chamber 57 or the clean room by introducing inert gas into the closed-type transport container 60. For example, a class 100 clean room is controlled so that the indoor temperature is 22-23° C.±2° C. and the relative humidity is 50%±10%. As shown in FIG. 10, when $N_2$ gas is introduced into the closed-type transport container 60 as a purge gas, the relative humidity rapidly decreases. For example, the relative humidity inside the closed-type transport container 60 decreases from the ambient relative humidity of about 50% to about 30% or less after 3 minutes from $N_2$ purge, about 10% or less after 5 minutes, about 1% after 45 minutes, and about 1% or less after 2 hours.

For example, after the relative humidity is decreased to 1% or less by $N_2$ purge for 3 hours, the valves 66a, 66b are closed to terminate the $N_2$ purge, thereby containing $N_2$ gas in the closed-type transport container 60. After the completion of the $N_2$ purge, the relative humidity inside the closed-type transport container 60 once increases rapidly, and then increases gradually. The increase of relative humidity immediately after the $N_2$ purge is attributed to moisture adsorbed on the wafer surface and the inner wall of the closed-type transport container 60. The gradual increase results from moisture passing through the resin material of the closed-type transport container 60. With $N_2$ gas contained, the relative humidity inside the closed-type transport container 60 can be kept at 30% or less for 50 hours or more, for example. Thus, by containing inert gas, the relative humidity inside the closed-type transport container 60 can be kept lower than the ambient relative humidity.

Figure 11:
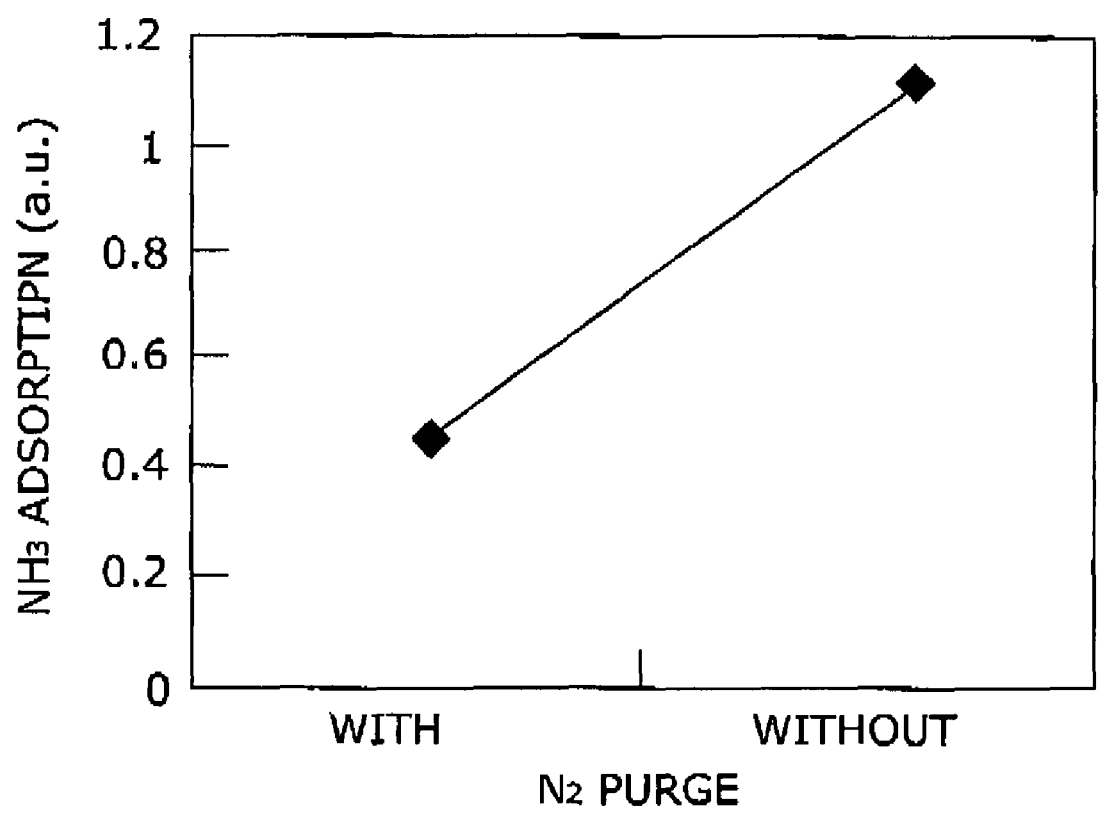
FIG. 11 shows an example result of inspecting ammonia contamination by nitrogen purge according to the embodiment of the invention.

As shown in FIG. 11, the effect of $N_2$ purge on $NH_3$ contamination was examined by using closed-type transport containers that had stored semiconductor wafers (intermediate products) with PSZ film formed thereon. When wafers with non-silazane SOG film for checking contamination were stored in an $N_2$-purged closed-type transport container containing $N_2$ gas, the adsorbed amount of $NH_3$ can be decreased to half or less relative to storage without $N_2$ purge. That is, even if a closed-type transport container contaminated with $NH_3$ is used, $N_2$ purge can avoid $NH_3$ contamination of semiconductor wafers stored in the closed-type transport container.

In accordance with the process flow shown in FIG. 4 using the closed-type transport container 60, a resist pattern was used as a mask to form a line-and-space pattern on a semiconductor wafer, and variation in line dimensions was examined. The design dimension of the line-and-space pattern is 70 nm. The dimensional tolerance is 70 nm±10%. In the embodiment of the invention, after the washing process of step S203, the closed-type transport container 60 is $N_2$ purged, and the intermediate product is transported to the photolithography process of step S204. In a first comparative example, the closed-type transport container is transported without $N_2$ purge. In a second comparative example, after the washing process of step S203, the semiconductor wafer is transported to the photolithography process of step S204 using a closed-type transport container with its inner wall washed.

Figure 12:
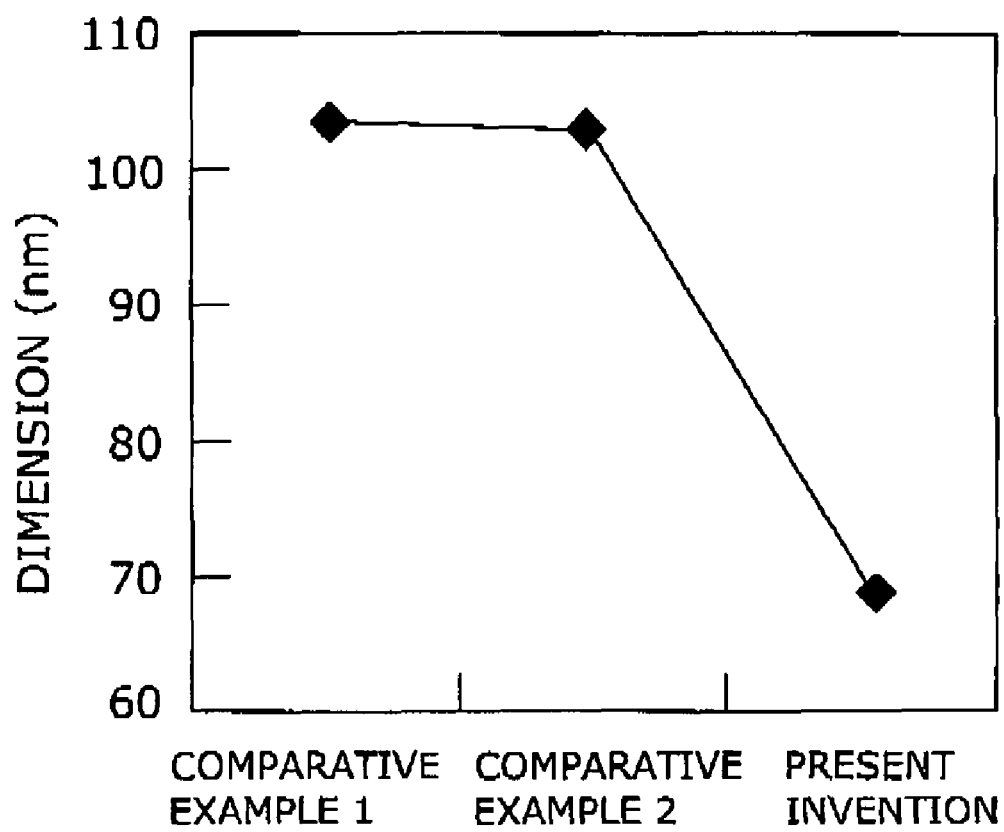
FIG. 12 shows an example dimensional variation of a pattern formed by a method for manufacturing a semiconductor device according to the embodiment of the invention.

As shown in FIG. 12, in the embodiment of the invention, the line dimension of the line-and-space pattern formed by RIE or other dry etching is about 70 nm. In contrast, both the first and second comparative example result in a line dimension of 100 nm or more, indicating that the dimensional variation exceeds the tolerance.

Figure 13:
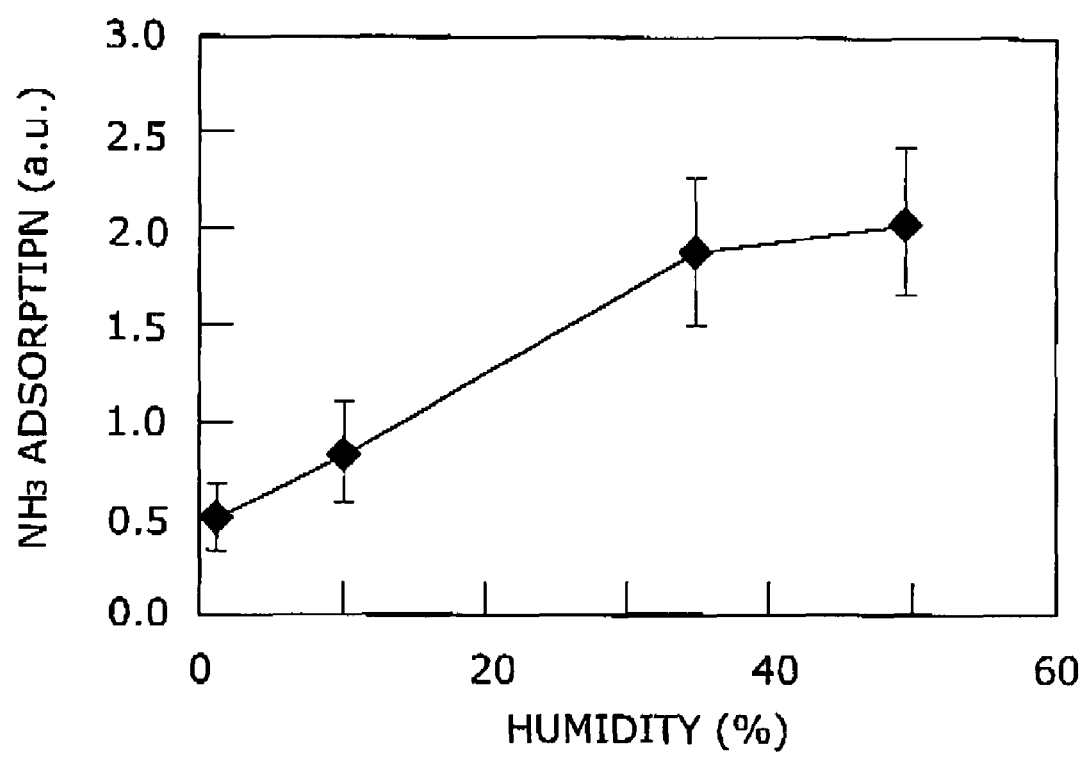
FIG. 13 shows an example relation of ammonia contamination to humidity inside the closed-type transport container according to the embodiment of the invention.

As shown in FIG. 13, when the relative humidity inside the closed-type transport container 60 is about 30% or less, the adsorbed amount of $NH_3$ decreases For example, it is confirmed that the dimensional variation for the design dimension of 70 nm can be restricted within a tolerance of ±10% when the relative humidity inside the closed-type transport container 60 is controlled to about 30% or less, preferably to about 10% or less, more preferably to about 1% or less, along the interprocess transport path from the washing process to the photolithography process.

According to the embodiment of the invention, release of $NH_3$ from semiconductor wafers with exposed PSZ film can be prevented by controlling the inside of the closed-type transport container to a low humidity. Furthermore, even if basic compounds containing nitrogen atoms are accumulated in the closed-type transport container due to contamination by exposed PSZ film and/or from the environment, contamination of semiconductor wafers with basic compounds containing nitrogen atoms can be prevented by controlling the inside of the closed-type transport container to a low humidity along a particular interprocess transport path. Hence there is no need for dedicated closed-type transport containers, and semiconductor devices can be manufactured without decreasing the production efficiency and increasing the manufacturing cost.

In the foregoing description, after the inside of the closed-type transport container 60 is purged with inert gas, the gas is contained and the inside is maintained at a low humidity. When intermediate products are stored in the closed-type transport container 60 for a long time, e.g., for a few days, moisture is released from the surface of the intermediate products or the inner wall of the closed-type transport container 60 and gradually increases the relative humidity as shown in FIG. 10. Hence it is preferable to intermittently repeat inert gas purge to control humidity. It is more preferable to continuously perform inert gas purge during long-term storage, because it can maintain the relative humidity at 1% or less.

In the method for manufacturing a semiconductor device according to the embodiment of the invention, the humidity inside the closed-type transport container 60 is controlled to be reduced along the particular interprocess transport path from the washing process to the photolithography process. However, the interprocess transport path subjected to humidity control is not limited thereto, but a plurality of interprocess transport paths may undergo humidity control. For example, the humidity inside the closed-type transport container 60 may be controlled also along the interprocess transport path from the photolithography process to the dry etching process. In this case, the shape variation of the resist pattern can be reduced along the interprocess transport path from the photolithography process to the dry etching process. Furthermore, the humidity inside the closed-type transport container 60 may be controlled along all the interprocess transport paths from the PSZ deposition process to the photolithography process. In this case, hydrolytic release of $NH_3$ from PSZ film deposited on the intermediate product is reduced, and $NH_3$ contamination of the closed-type transport container 60 can be prevented.

In the embodiment of the invention, $N_2$ gas is used as a means for decreasing humidity inside the closed-type transport container 60. However, it is possible to use other inert gas such as argon (Ar), helium (He), neon (Ne), krypton (Kr), or xenon (Xe), or mixed gas thereof. It is also possible to use dry air from which acidic/basic gas and organic or other molecular contaminants are removed. Furthermore, desiccants based on highly hygroscopic materials such as magnesium chloride ($MgCl_2$), magnesium oxide (MgO), magnesium hydroxide ($Mg(OH)_2$), calcium chloride ($CaCl_2$), silica gel, and zeolite, or dehumidifying elements based on solid polymer electrolyte film may be used as a means for controlling humidity. Moreover, inert gas can be used in combination with desiccants or dehumidifying elements.

The foregoing description illustrates the process for depositing PSZ film as a contaminating process that causes $NH_3$ contamination. However, the contaminating process is not limited thereto. Processes using $NH_3$ gas such as the CVD process for $Si_3N_4$ film and the DE process for low dielectric constant organic insulating film may also act as $NH_3$ contaminating processes.

Highly sensitive photoresist suffers from shape variation due to contamination with not only $NH_3$, but also other basic compounds containing nitrogen atoms such as amines including primary to tertiary amines in which one or more hydrogen atoms of $NH_3$ are replaced by hydrocarbon groups. Hence it is preferable to control the humidity inside the closed-type transport container 60 for transport along the interprocess transport path from the process involving basic compounds containing nitrogen atoms to the photolithography process.

Next, as an example method for manufacturing a semiconductor device according to the embodiment of the invention, a method for manufacturing a NAND nonvolatile semiconductor memory device will be described with reference to FIGS. 17 to 30. The method includes interprocess transport paths for transporting semiconductor wafers with exposed PSZ film, and a silazane perhydride polymer solution is used as an STI filling material. However, by way of introduction, a completed NAND nonvolatile semiconductor memory device is described with reference to FIGS. 14 to 16.

Figure 14:
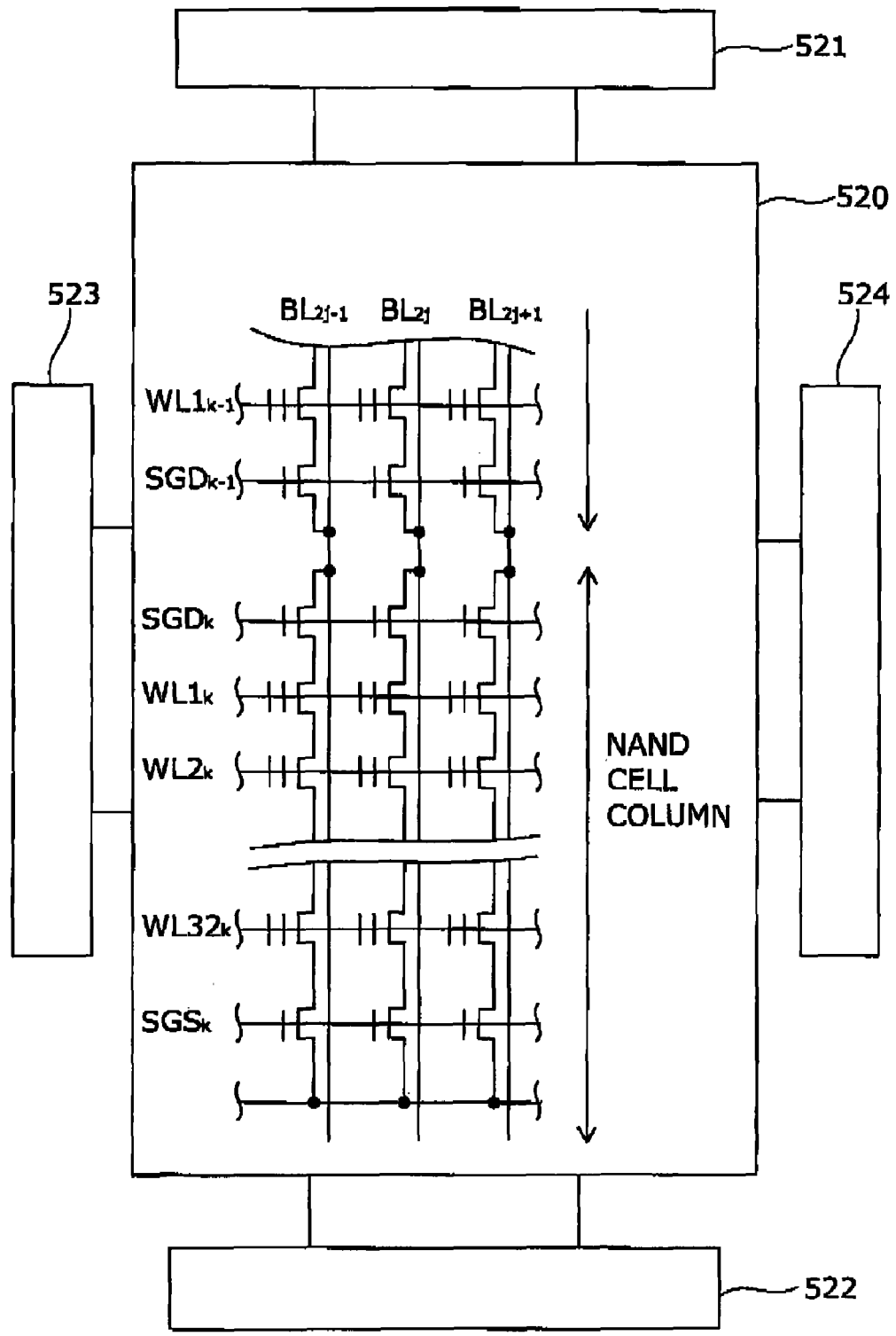
FIG. 14 is a block diagram showing a logical circuit configuration of a semiconductor memory device according to the embodiment of the invention.
Figure 15:
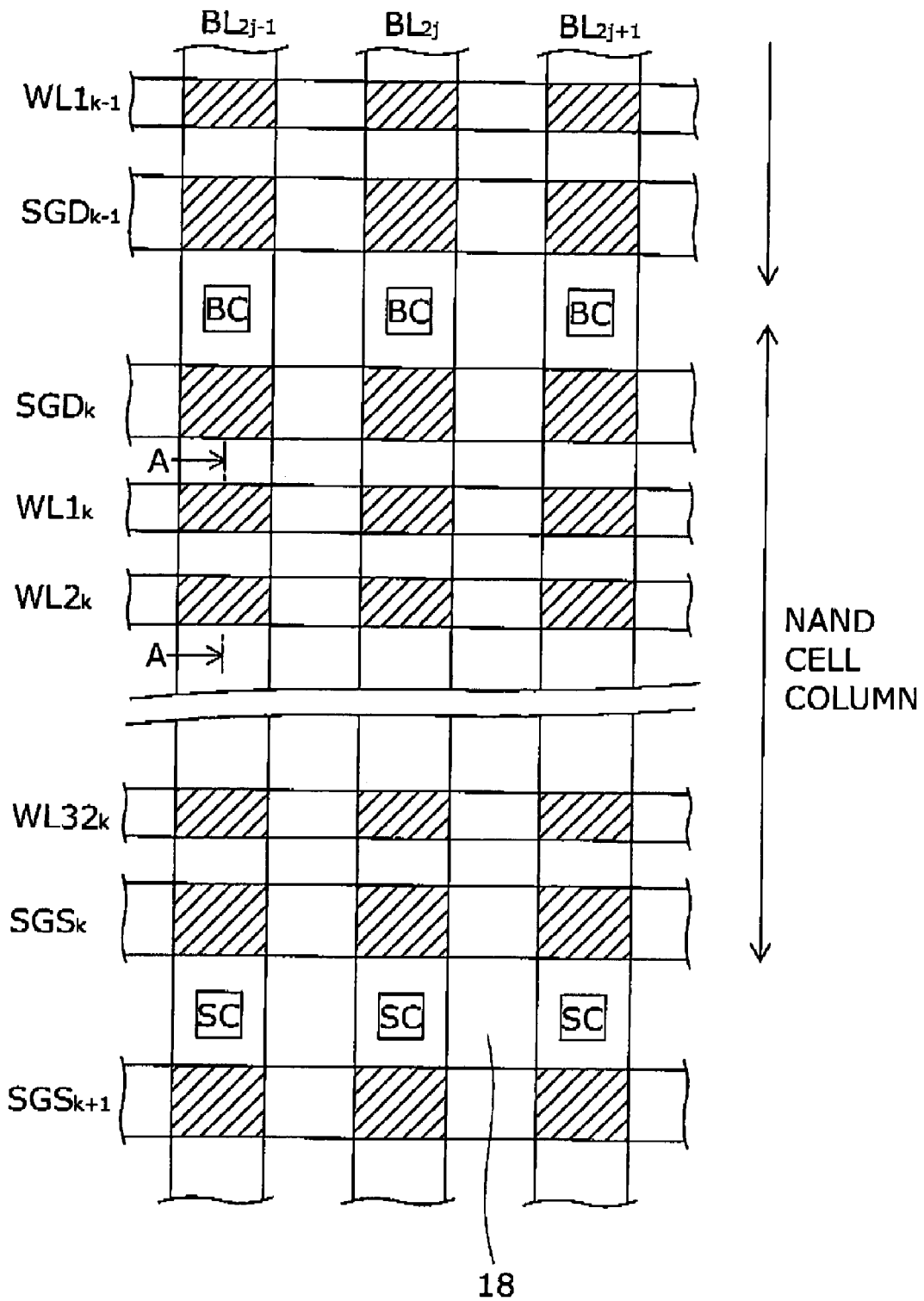
FIG. 15 is a schematic plan view showing a physical layout pattern configuration of part of a memory cell array of the semiconductor memory device shown in FIG. 14.

FIG. 14 is a block diagram showing a schematic circuit configuration of a NAND nonvolatile semiconductor memory device (flash memory). A memory cell array 520 is surrounded by peripheral circuits (521, 522, 523, 524) such as a top page buffer 521, a bottom page buffer 522, a left row decoder/charge pump 523, and a right row decoder/charge pump 524. As shown in FIG. 15, the memory cell array 520 comprises a plurality of word lines $WL1_k, WL2_k, \ldots, WL32_k, WL1_{k-1}, \ldots$ arranged in the row direction and a plurality of bit lines $BL_{2j-1}, BL_{2j}, BL_{2j+1}, \ldots$ arranged in the column direction orthogonal to the word lines $WL1_k, WL2_k, \ldots, WL32_k, WL1_{k-1}, \ldots$. In the column direction of FIG. 15, memory cell transistors each having a charge storage layer are arranged, where the charge storage state of the charge storage layer is controlled by one of the plurality of word lines $WL1_k, WL2_k, \ldots, WL32_k, WL1_{k-1}, \ldots$. As shown in the plan view of FIG. 15, device isolation insulating films 18 made of PSZ film run parallel to the column direction, and thereby the memory cell transistors adjacent to each other across the device isolation insulating film 18 made of PSZ film are isolated from each other. FIGS. 14 and 15 show a configuration where 32 memory cell transistors are arranged in the column direction to form a memory cell column. At both ends of the arrangement of these memory cell columns, pairs of select transistors for selecting a set of memory cell transistors arranged in the memory cell column are placed adjacent to each other in the column direction. A pair of select gate interconnects $SGD_k, SGS_k$ are connected to the gates of the pair of select transistors, respectively. A plurality of bit line contacts BC and source contacts SC are connected to the source/drain regions of the select transistors. The top page buffer 521 and the bottom page buffer 522 are connected to the bit lines $BL_{2j-1}, BL_{2j}, BL_{2j+1}, \ldots$ and each serve as a buffer in reading the associated memory cell column information. The left row decoder/charge pump 523 and the right row decoder/charge pump 524 are connected to the word lines $WL1_k, WL2_k, \ldots, WL32_k, WL1_{k-1}, \ldots$ to control the charge storage state of each memory cell transistor constituting the memory cell column.

Figure 16:
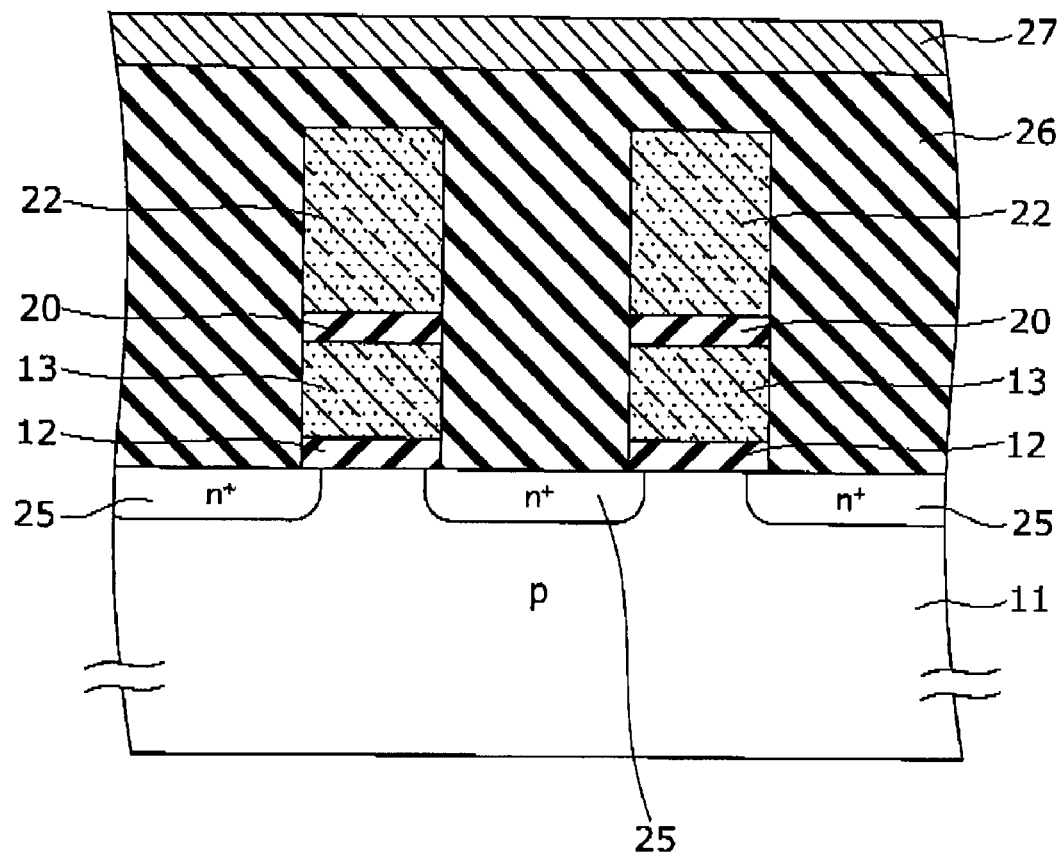
FIG. 16 is a cross-sectional view showing part (NAND cell column) of the memory cell array cut along the bit line (A-A direction) in FIG. 15.

FIG. 16 is a schematic cross-sectional view showing part of the memory cell array 520 as viewed along the A-A direction (column direction) in FIG. 15. That is, FIG. 16 corresponds to a cross section taken along the direction of the bit lines $BL_{2j-1}, BL_{2j}, BL_{2j+1}, \ldots$ in FIG. 14. As shown in the cross-sectional view of FIG. 16, a source/drain region 25 of the memory cell transistor is formed in the surface of a p-type semiconductor substrate 11, and a gate insulating film (tunnel oxide film) 12 is located on a channel region defined between each pair of source/drain regions 25. The source/drain region 25 is an $n^+$-type semiconductor region formed by doping the p-type semiconductor substrate 11 with n-type dopants at high concentration. Although not shown in FIG. 16, but obviously from FIGS. 14 and 15, a select transistor having nearly the same structure as the memory cell transistor is located at the end of the memory cell column, and the source/drain region of the select transistor serves as a bit line contact region. The p-type semiconductor substrate 11 may be replaced by a p-type well region (p-well) formed in an n-type semiconductor substrate.

A floating electrode 13 for storing charge, an interelectrode insulating film 20 on the floating electrode 13, and a control electrode 22 on the interelectrode insulating film 20 are located on the gate insulating film (tunnel oxide film) 12 to constitute a gate electrode of each memory cell transistor Although not shown, the select transistor also has a gate electrode structure comprising a gate insulating film (tunnel oxide film) 12, a floating electrode 13, an interelectrode insulating film 20, and a control electrode 22 electrically continuous with the floating electrode 13 through an opening in the interelectrode insulating film 20. However, the control electrode 22 is electrically continuous with the floating electrode 13 through an interelectrode insulating film short-circuit window of the interelectrode insulating film 20. As can be understood from FIG. 15, the floating electrodes 13 of the memory cell transistors belonging to adjacent memory cell columns are opposed to each other in the row direction (word line direction) across the device isolation insulating film 18 made of PSZ film constituting the STI.

The floating electrode 13 serving as a charge storage layer is formed from polycrystalline silicon film doped with n-type dopants such as phosphorus (P) or arsenic (As) (hereinafter referred to as "doped polycrystalline silicon film").

The control electrode 22 may have a three-layer structure composed of a polycrystalline silicon film doped with n-type dopants, a tungsten silicide ($WSi_2$) film, and a cap insulating film. The tungsten silicide ($WSi_2$) film may be replaced by any other metal silicide film such as cobalt silicide ($CoSi_2$) film, titanium silicide ($TiSi_2$) film, or molybdenum silicide ($MoSi_2$) film. Instead of silicide film, high-melting-point metal such as tungsten (W), cobalt (Co), titanium (Ti), or molybdenum (Mo), or polycide film based on these silicide films may be used. Instead of using silicide film, a highly conductive metal film made of aluminum (Al) or copper (Cu) may be placed on the polycrystalline silicon film to also serve as the word lines $WL1_k, WL2_k, \ldots, WL32_k, WL1_{k-1}, \ldots$. Alternatively, the silicide film may be replaced by a laminated film made of one or more of tungsten nitride (WN) film and titanium nitride (TiN, $TiN_2$) film on the polycrystalline silicon film.

Although not shown, the peripheral transistor is configured as a transistor having nearly the same laminated structure as the select transistor, or as a transistor having a gate electrode corresponding to the structure only with the control electrode 22 where the floating electrode 13 and the interelectrode insulating film 20 are omitted from the laminated structure of the select transistor.

As is obvious from the cross-sectional view taken along the bit line direction shown in FIG. 16, in the semiconductor memory device according to the embodiment of the invention, the floating electrodes 13 of the memory cell transistors are opposed to each other across an interlayer insulating film 26. Here, when an interlayer insulating film 26 having a relative dielectric constant $\epsilon_r$ lower than 3.9 is buried between each pair of floating electrodes 13 of the plurality of memory cell transistors arranged in the column direction, miswrite due to the interference effect between cells neighboring in the column direction can be prevented between memory cell transistors adjacent to each other in the column direction in the same column.

In FIG. 16, the structure is not shown in detail. However, for example, a cell isolation underlying film made of silicon oxide film having a thickness of about 6 nm may be formed on the sidewall of the laminated structure (13, 20, 22) composed of the polycrystalline silicon film (first conductive layer) 13, the interelectrode insulating film 20, and the control electrode 22. A two-layer structure composed of an interlayer insulating film 26 and a core filling insulating film may be used between the select transistors of cell columns adjacent to each other in the row direction. The core filling insulating film can be made of BPSG film, for example. That is, the center of a recess formed by the interlayer insulating film 26 may be filled with a core filling insulating film, and a contact plug may be buried to pass through the center of the core filling insulating film. The contact plug has a low contact resistance and forms ohmic contact with the bit line contact region (not shown). The contact plug is connected to the bit line ($BL_{2j}$) 27 located on the interlayer insulating film 26. In FIG. 16, the bit line 27 is located on the interlayer insulating film 26. However, damascene interconnect may also be used, where a damascene trench is formed in the interlayer insulating film 26, and metal interconnect primarily composed of copper (Cu) is buried inside the damascene trench.

Next, a method for manufacturing a semiconductor device according to the embodiment of the invention is described with reference to FIGS. 17 to 30. Here, FIGS. 17 to 26 are cross-sectional views taken parallel to the word lines $WL1_k$, $WL2_k$, ..., $WL32_k$, $WL1_{k-1}$, ... shown in FIG. 15 and cutting a particular word line. FIGS. 27 to 30 are cross-sectional views taken parallel to the bit lines $BL_{2j-1}$, $BL_{2j}$, $BL_{2j+1}$, ... corresponding to the A-A direction in FIG. 15.

The flow of manufacturing processes shown in FIGS. 17 to 30 is presented for convenience of describing a method for manufacturing a semiconductor device according to the embodiment of the invention. In practice, some other processes such as an ion implantation process for threshold control may be added to the flow of the method for manufacturing a NAND nonvolatile semiconductor memory device (flash memory) shown in the following (a) to (s). That is, the method for manufacturing a NAND nonvolatile semiconductor memory device described below is an example for the understanding of the method for manufacturing a semiconductor device. It is understood that NAND nonvolatile semiconductor memory devices can be manufactured by various other flows of manufacturing processes, including the above variation, within the spirit and scope of the invention.

As shown in FIG. 3, in the manufacturing apparatus 58 used for description, the closed-type transport container 60 is transported via the transport rail 54 onto the load port 56 of the manufacturing apparatus 58. The lid 62 of the closed-type transport container 60 is automatically opened in the load port 56. Intermediate products (semiconductor wafers) are transferred from the closed-type transport container 60 to the manufacturing apparatus 58 through the transfer chamber 57 locally cleaned as a clean area, and undergo processing of a prescribed process. Upon completion of the processing of the process, the resulting intermediate products are transferred to the load port 56 through the transfer chamber 57. Inside the load port 56, the intermediate products are automatically stored in the closed-type transport container 60. The lid 62 of the closed-type transport container 60 is automatically closed. In the following description, transfer of semiconductor wafers performed in each manufacturing apparatus is the same as above and not described in detail.

Figure 17:
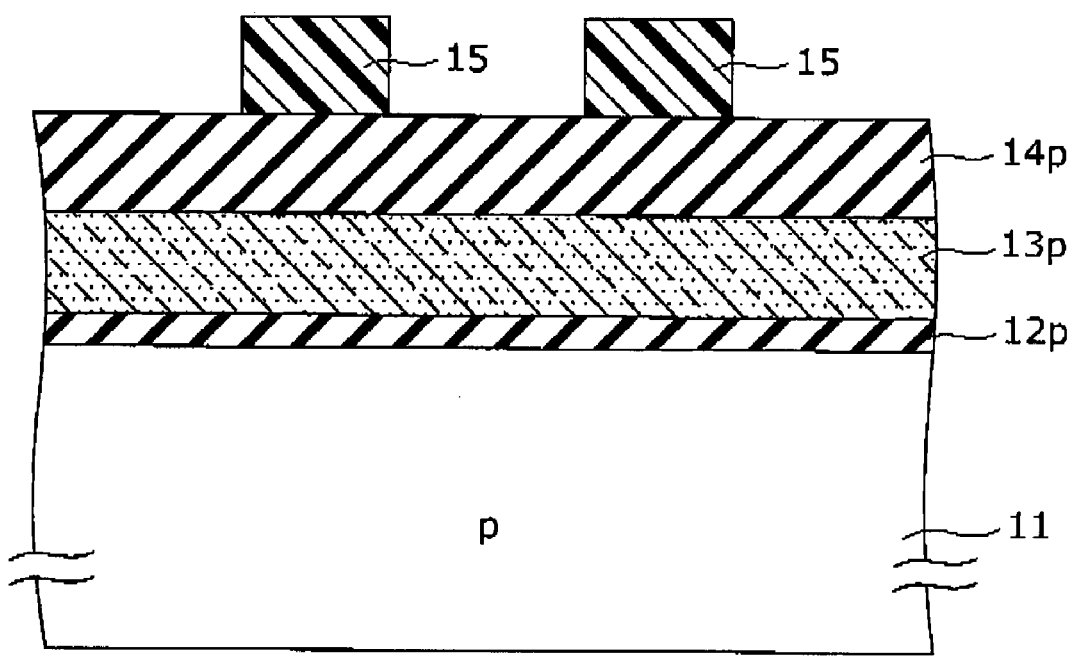
FIGS. 17 to 30 are process cross-sectional views showing an example method for manufacturing a semiconductor device according to the embodiment of the invention.

(a) For simplicity of description, it is assumed that a gate oxidation apparatus, a polysilicon reduced-pressure CVD apparatus, and a nitride film reduced-pressure CVD apparatus have been used to successively deposit a tunnel oxide film 12p, a polycrystalline silicon film (first conductive layer) 13p serving as a floating electrode, and a CMP stopper layer 14p such as an $Si_3N_4$ film on a p-type silicon substrate 11 (or n-type silicon substrate with p-type wells formed therein) serving as an "intermediate product". Furthermore, as shown in FIG. 17, a spinner, a stepper, and a developing apparatus have been used to form a resist mask 15 on the CMP stopper layer 14p. For instance, the tunnel oxide film 12p has a thickness of about 1 to 15 nm, e.g. about 8 nm, the first conductive layer 13p has a thickness of about 10 to 200 nm, e.g. about 150 nm, and the CMP stopper layer 14p has a thickness of about 80 to 300 nm, e.g. about 100 nm. The semiconductor wafer 11 with the resist mask 15 formed thereon, after resist curing, is transferred to the load port of the developing apparatus. Inside the load port of the developing apparatus, the semiconductor wafer 11 is stored in the closed-type transport container 60, which is transported via the transport rail 54 to the load port of the RIE apparatus.

(b) From the closed-type transport container 60 transported to the load port of the RIE apparatus, the semiconductor wafer 11 is transferred into the etching chamber of the RIE apparatus. The resist mask 15 is used to continuously etch the CMP stopper layer 14p, the first conductive layer 13p, and the tunnel oxide film 12p, thereby forming a sequentially laminated pattern of a tunnel oxide film 12, a first conductive layer 13, a CMP stopper layer 14, and the resist mask 15. Continuous RIE is further carried on in the etching chamber of the RIE apparatus to etch the silicon substrate 11. After completion of the continuous RIE, the semiconductor. wafer 11 is transferred to the load port of the RIE apparatus and stored in the closed-type transport container 60, which is transported via the transport rail 54 to the load port of the washer.

Figure 18:
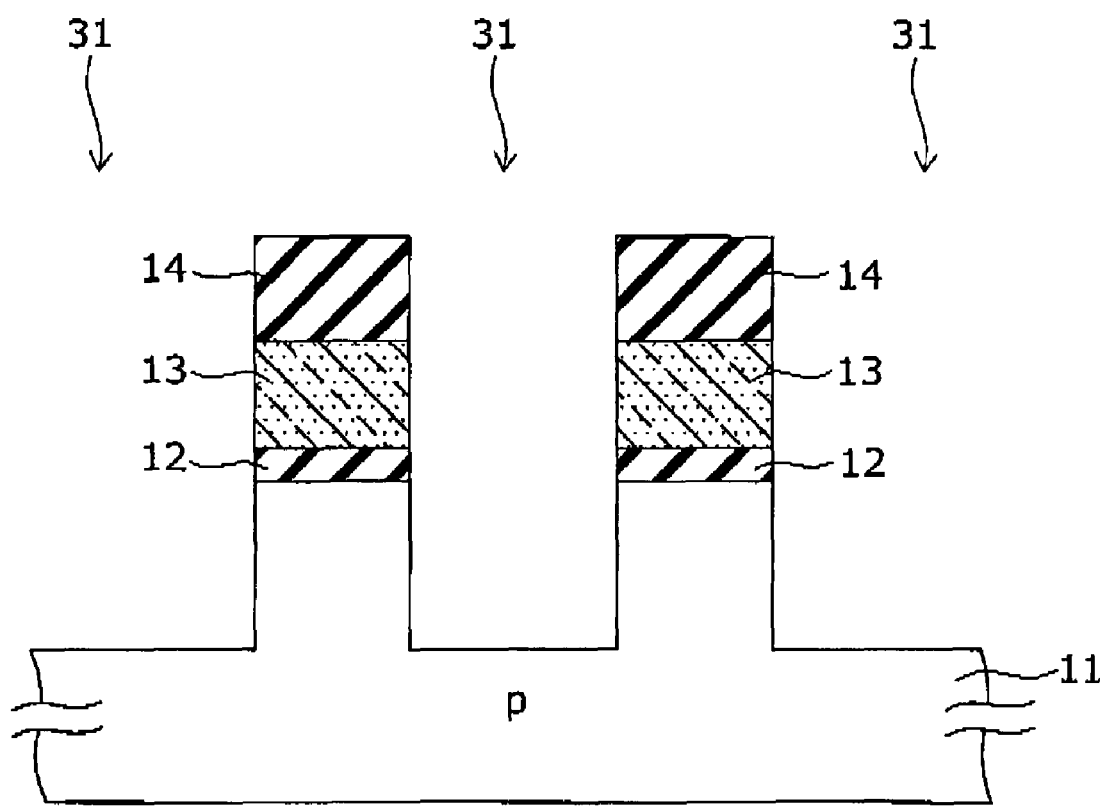

(c) From the closed-type transport container 60 transported to the load port of the washer, the semiconductor wafer 11 is transferred to the washing bath of the washer, and the resist mask 15 is removed. Upon removal of the resist mask 15, as shown in FIG. 18, device isolation grooves 31 are formed in the silicon substrate 11. In FIG. 18, the device isolation grooves 31 are formed as stripes extending perpendicular to the page and parallel to each other. The protrusion made of the semiconductor substrate 11 sandwiched on both sides between the device isolation grooves 31 serves as an active region (AA). The semiconductor wafer 11 from which the resist mask 15 has been removed is transferred to the load port of the washer and stored in the closed-type transport container 60, which is transported via the transport rail 54 to the load port of the silazane perhydride coater.

Figure 19:
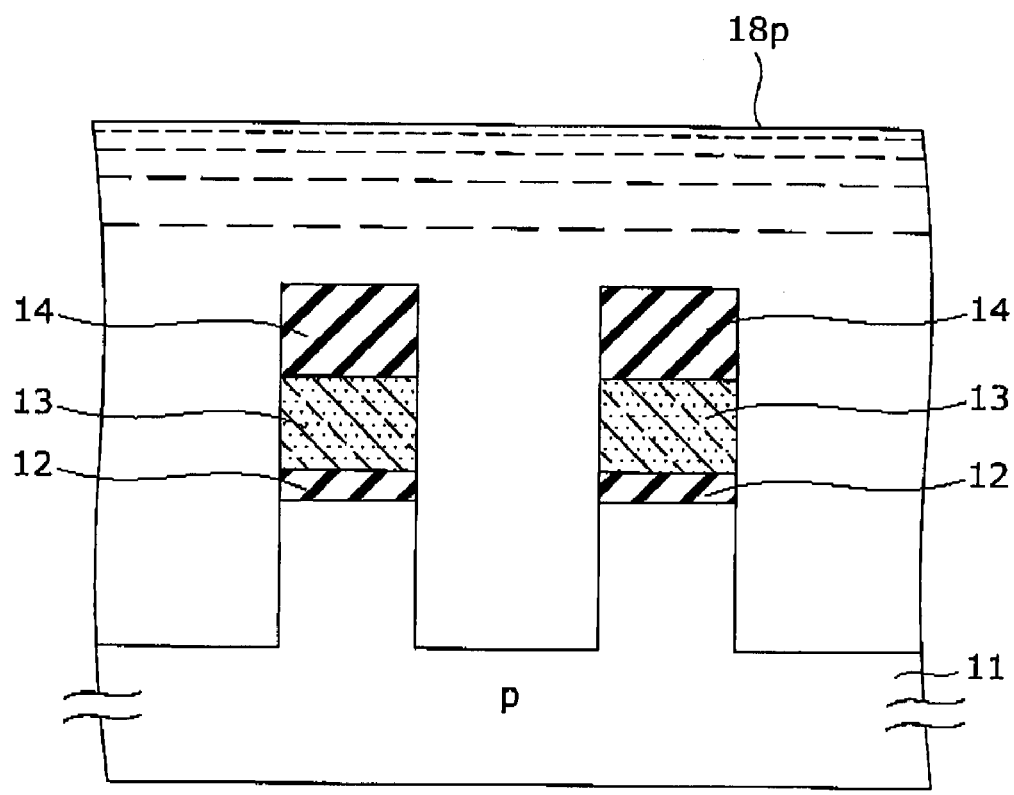

(d) From the closed-type transport container 60 transported to the load port of the silazane perhydride coater, the semiconductor wafer 11 is transferred to the rotary stage of the silazane perhydride coater. A silazane perhydride polymer solution 18p is applied, by spin coating, onto the entire surface of the silicon substrate 11, the tunnel oxide film 12, the first conductive layer 13, and the CMP stopper layer 14 so as to completely fill the device isolation grooves 31 as shown in FIG. 19. The silazane perhydride polymer solution 18p is applied to a thickness of about 500 to 1000 nm, e.g. about 600 nm. Then the semiconductor wafer 11 is transferred to the load port of the silazane perhydride coater and stored in the closed-type transport container 60, which is transported via the transport rail 54 to the load port of the silazane perhydride baking apparatus.

Figure 20:
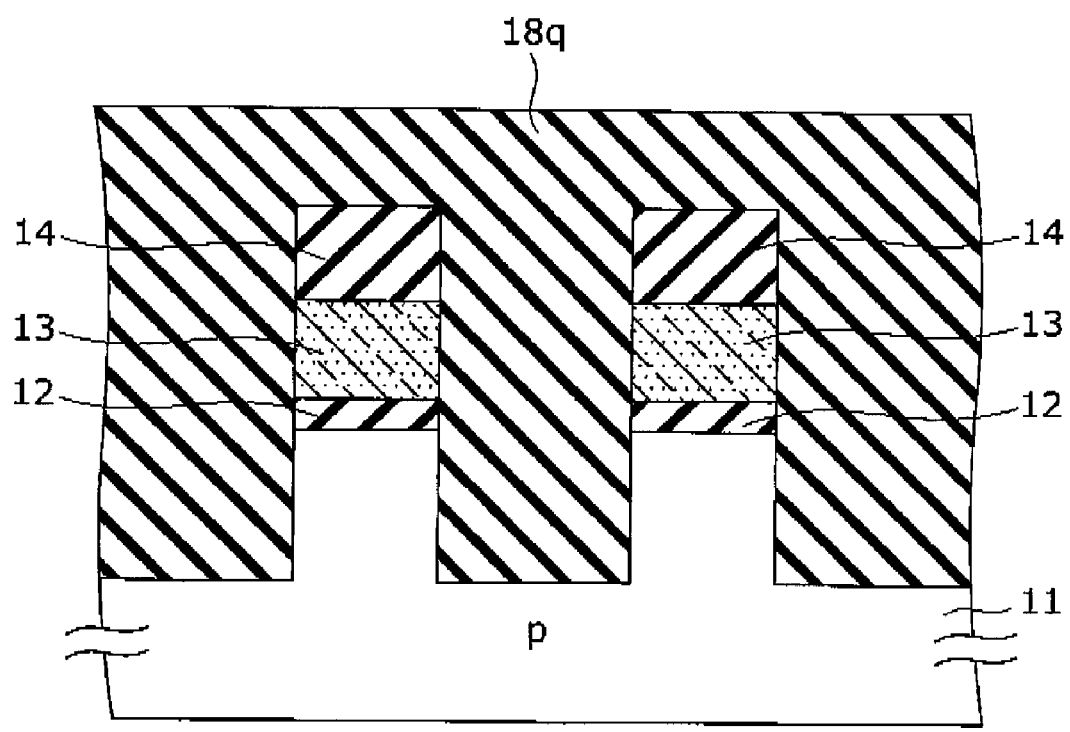

(e) From the closed-type transport container 60 transported to the load port of the silazane perhydride baking apparatus, the semiconductor wafer 11 is transferred to the silazane perhydride baking apparatus. The silazane perhydride polymer solution (silazane perhydride coating) 18p applied by the silazane perhydride coater is baked at 200° C. or less, e.g. about 150° C., for about three minutes. By this baking process, the solvent of the silazane perhydride polymer solution 18p is volatilized to form a PSZ film 18q as shown in FIG. 20. The semiconductor wafer 11 with the PSZ film 18q formed thereon is transferred to the load port of the silazane perhydride baking apparatus and stored in the closed-type transport container 60, which is transported via the transport rail 54 to the load port of the PSZ film oxidation apparatus.

(f) From the closed-type transport container 60 transported to the load port of the PSZ film oxidation apparatus, the semiconductor wafer 11 is transferred to the PSZ film oxidation apparatus. The PSZ film 18q formed by the silazane perhydride baking apparatus is oxidized at a temperature higher than 200° C. and not higher than 600° C. By this oxidation, the PSZ film 18q is transformed to an $SiO_2$ film 18r. The semiconductor wafer 11 with the PSZ film 18q transformed to the $SiO_2$ film 18r is transferred to the load port of the PSZ film oxidation apparatus and stored in the closed-type transport container 60, which is transported via the transport rail 54 to the load port of the CMP apparatus.

Figure 21:
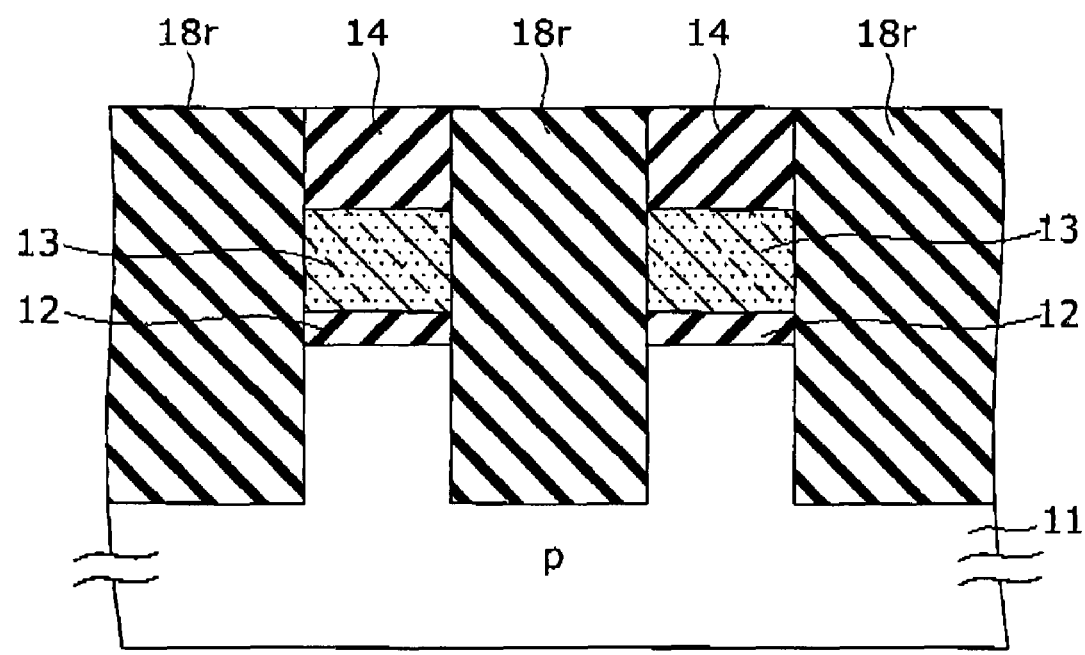

(g) From the closed-type transport container 60 transported to the load port of the CMP apparatus, the semiconductor wafer 11 is transferred to the CMP apparatus. The CMP stopper layer 14 is used as a stopper to polish the $SiO_2$ film 18r outside the trench and to planarize the surface by the CMP process as shown in FIG. 21. The semiconductor wafer 11 with the surface planarized is transferred to the load port of the CMP apparatus and stored in the closed-type transport container 60, which is transported via the transport rail 54 to the load port of the wet etching apparatus.

Figure 22:
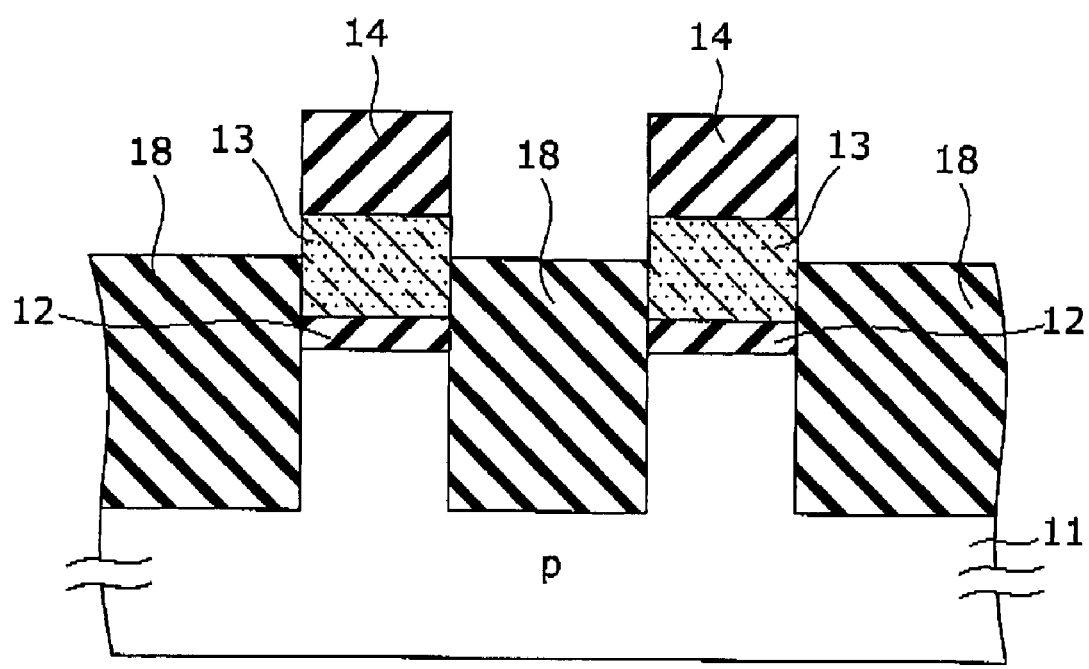
Figure 23:
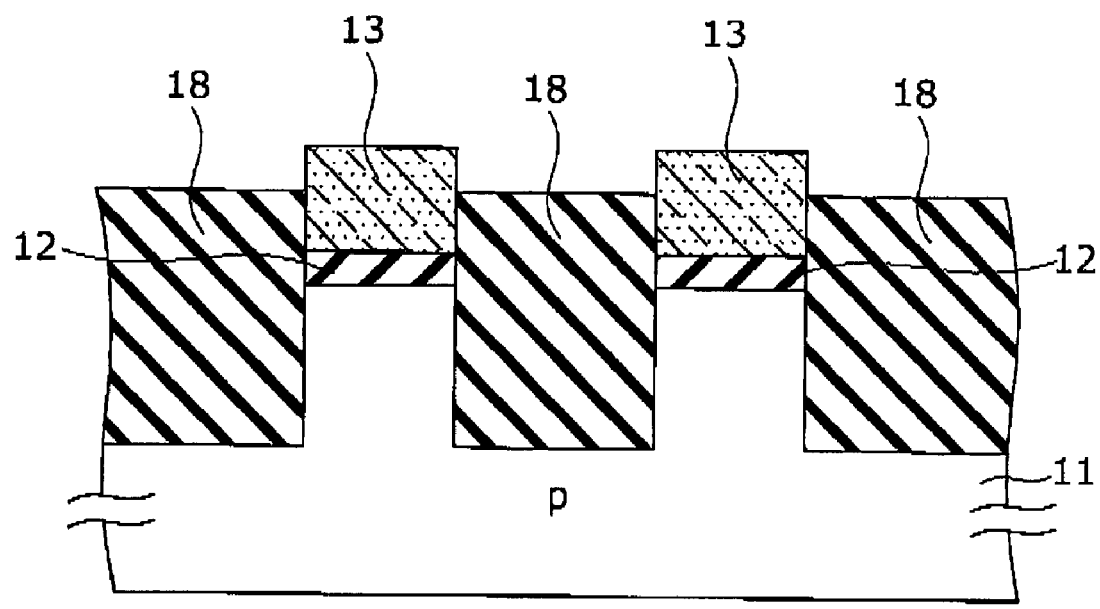

(h) From the closed-type transport container 60 transported to the load port of the wet etching apparatus, the semiconductor wafer 11 is transferred to the wet etching apparatus. The upper portion of the $SiO_2$ film 18r is removed by wet etching with dilute hydrofluoric acid (HF) solution to bury the device isolation insulating film 18 in the deep recesses of the device isolation groove 31 as shown in FIG. 22. Furthermore, the CMP stopper layer 14 is removed by wet etching with phosphoric acid ($H_3PO_4$) solution as shown in FIG. 23. As a result, by the removal of the upper portion of the $SiO_2$ film 18r, the upper portion of the side face of the first conductive layer 13 is exposed e.g. about 100 nm from the upper face of the device isolation insulating film 18 as shown in FIG. 23. The semiconductor wafer 11 as shown in FIG. 23 is subjected to prescribed washing, which is a preprocessing of reduced-pressure CVD on the interelectrode insulating film. Then the semiconductor wafer 11 is transferred to the load port of the wet etching apparatus and stored in the closed-type transport container 60, which is transported via the transport rail 54 to the load port of the interelectrode insulating film reduced-pressure CVD apparatus.

Figure 24:
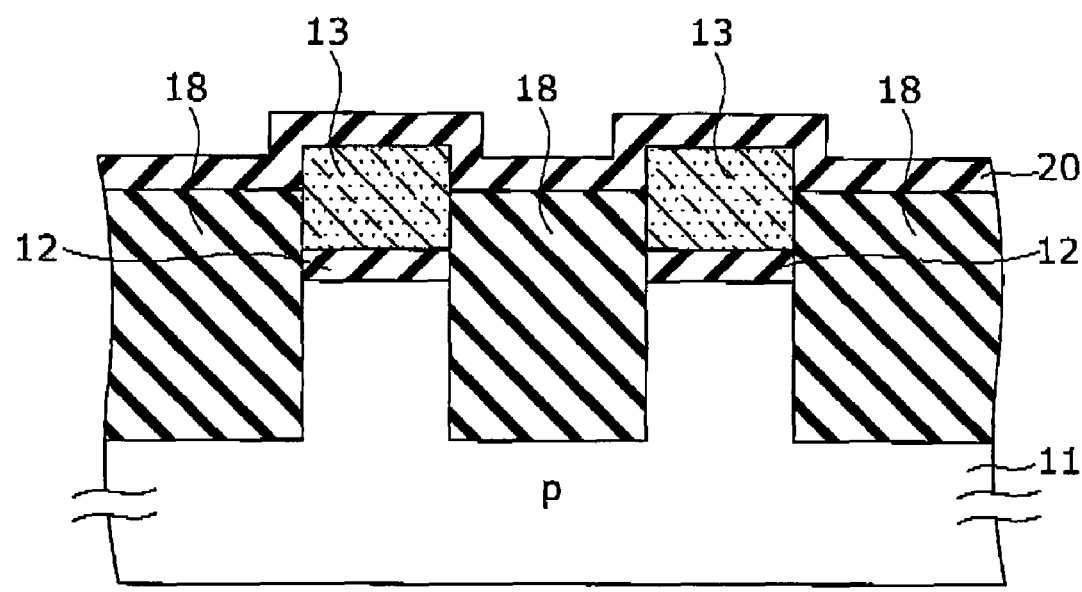

(i) From the closed-type transport container 60 transported to the load port of the interelectrode insulating film reduced-pressure CVD apparatus, the semiconductor wafer 11 is transferred to the interelectrode insulating film reduced-pressure CVD apparatus. As shown in FIG. 24, an interelectrode insulating film 20 is deposited on the first conductive layer 13 and the device isolation insulating film 18. The semiconductor wafer 11 with the device isolation insulating film 18 covered with the interelectrode insulating film 20 is transferred to the load port of the interelectrode insulating film reduced-pressure CVD apparatus and stored in the closed-type transport container 60, which is transported via the transport rail 54 to the load port of the polysilicon reduced-pressure CVD apparatus.

Figure 25:
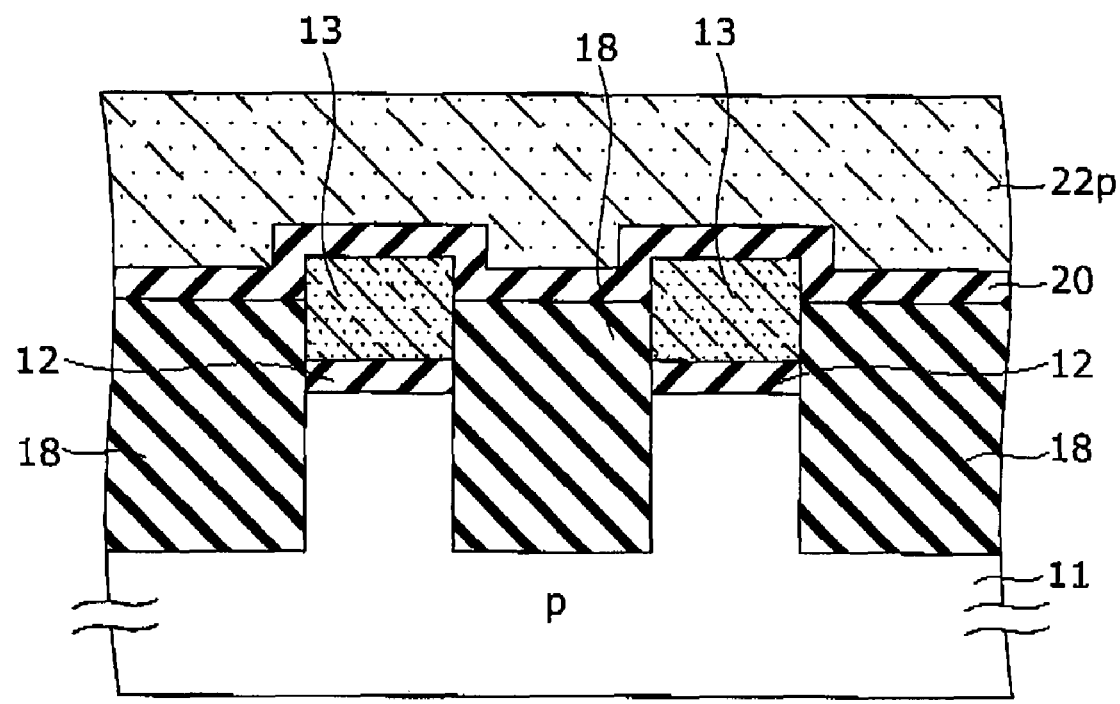

(j) From the closed-type transport container 60 transported to the load port of the polysilicon reduced-pressure CVD apparatus, the semiconductor wafer 11 is transferred to the polysilicon reduced-pressure CVD apparatus. As shown in FIG. 25, a second conductive layer 22p serving as a control electrode 22 shown in FIG. 16 is deposited on the interelectrode insulating film 20. For example, a polycrystalline silicon film is deposited on the interelectrode insulating film 20 to a thickness of 10 to 200 nm by reduced-pressure CVD. Then the semiconductor wafer 11 is transferred to the load port of the polysilicon reduced-pressure CVD apparatus and stored in the closed-type transport container 60. Valves 66a, 66b are connected to the breathing filters 64a, 64b of the closed-type transport container 60, and the inside of the closed-type transport container 60 is purged with inert gas for 5 to 180 minutes. After inert gas purge, the valves 66a, 66b are closed, and the outlet/inlet of the valves 66a, 66b are detached. The closed-type transport container 60 is transported via the transport rail 54 to the load port of the spinner.

(k) From the closed-type transport container 60 transported to the load port of the spinner, the semiconductor wafer 11 is transferred to the rotary stage of the spinner. A photoresist film is applied onto the entire surface of the second conductive layer 22p. The semiconductor wafer 11 coated with the photoresist film, after prebaking, is transferred to the load port of the spinner and stored in the closed-type transport container 60. Valves 66a, 66b are connected to the breathing filters 64a, 64b of the closed-type transport container 60, and the inside of the closed-type transport container 60 is purged with inert gas for 5 to 180 minutes. After inert gas purge, the valves 66a, 66b are closed, and the outlet/inlet of the valves 66a, 66b are detached. The closed-type transport container 60 is transported via the transport rail 54 to the load port of the stepper (l) From the closed-type transport container 60 transported to the load port of the stepper, the semiconductor wafer 11 is transferred to the exposure stage of the stepper. An image of a prescribed mask pattern is projected on the photoresist film by the step-and-repeat exposure, and thereby the image of a desired mask pattern is transferred. The semiconductor wafer 11 with the image of the mask pattern transferred thereon, after postbaking, is transferred to the load port of the stepper and stored in the closed-type transport container 60. The outlet/inlet of the valves 66a, 66b are connected to the breathing filters 64a, 64b of the closed-type transport container 60, and the inside of the closed-type transport container 60 is purged with inert gas for 5 to 180 minutes. After inert gas purge, the valves 66a, 66b are closed, and the outlet/inlet of the valves 66a, 66b are detached. The closed-type transport container 60 is transported via the transport rail 54 to the load port of the developing apparatus.

Figure 26:
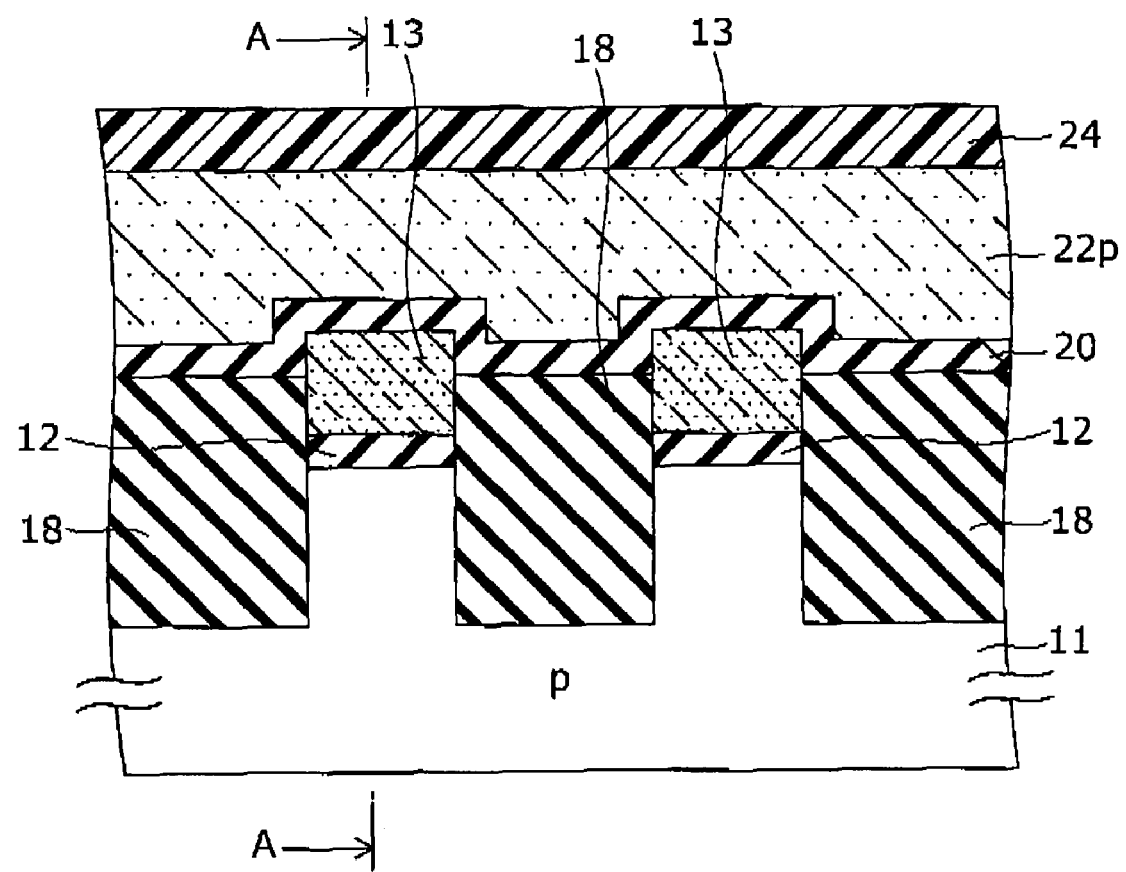

(m) From the closed-type transport container 60 transported to the load port of the developing apparatus, the semiconductor wafer 11 is transferred to the developing apparatus, and the photoresist film is developed by developer liquid. As a result, as shown in FIG. 26, a resist mask 24 is formed on the second conductive layer 22p. The semiconductor wafer 11 with the resist mask 24 formed thereon, after resist curing, is transferred to the load port of the developing apparatus and stored in the closed-type transport container 60, which is transported via the transport rail 54 to the load port of the RIE apparatus.

Figure 27:
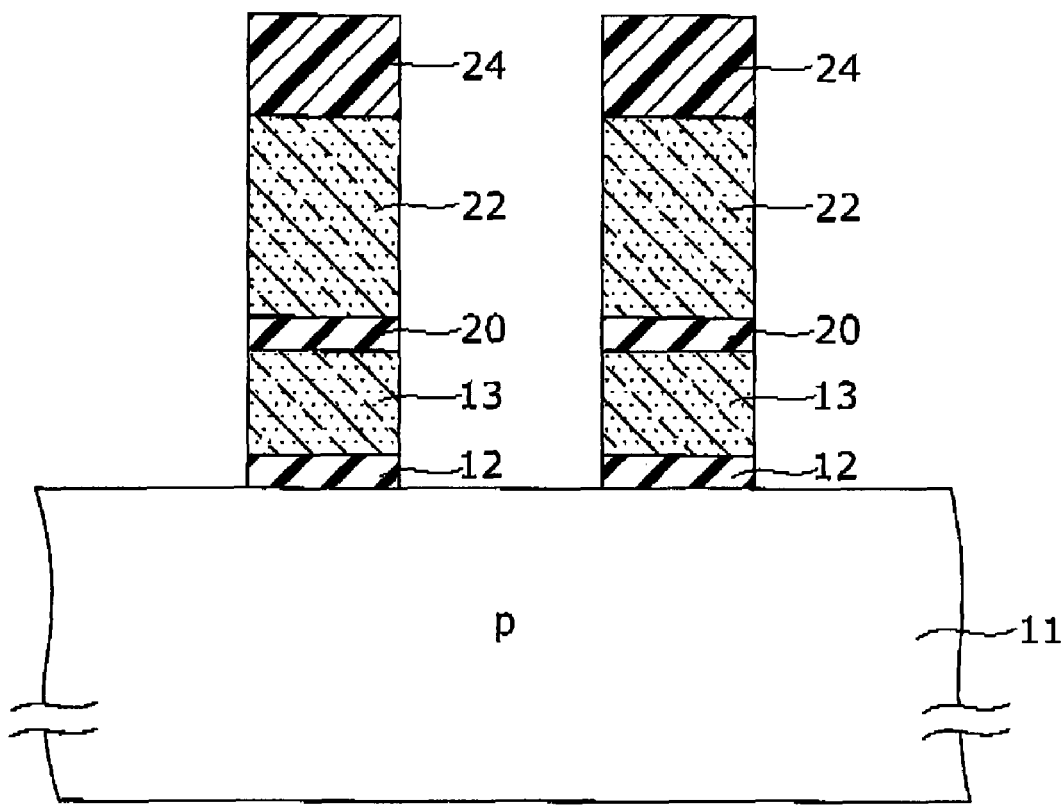

(n) From the closed-type transport container 60 transported to the load port of the RIE apparatus, the semiconductor wafer 11 is transferred into the etching chamber of the RIE apparatus. The resist mask 24 is used as an etching mask for isolation between cells within a column to selectively etch the second conductive layer 22p, the interelectrode insulating film 20, the first conductive layer 13, and the gate insulating film 12 until the silicon substrate 11 is exposed, thereby forming a plurality of slit-like cell isolation grooves extending in the row direction (word line direction). As a result, as shown in FIG. 27, memory cell transistors within a cell column are isolated from each other. (The cross-sectional structure of FIG. 27 shows a cross section as viewed along the A-A direction perpendicular to the page of FIG. 26. That is, FIGS. 17 to 26 have been described with reference to the cross section taken parallel to the word lines $WL1_k$, $WL2_k$, ..., $WL32_k$, $WL1_{k-1}$, ... shown in FIG. 15 and cutting a particular word line. FIGS. 27 to 30 will be described with reference to a cross section taken parallel to the bit lines $BL_{2j-1}$, $BL_{2j}$, $BL_{2j+1}$, ... corresponding to the A-A direction in FIG. 15.) The cell isolation groove allows the floating electrode 13 made of the first conductive layer and the control electrode 22 of each memory transistor within a cell column to be isolated. Although not shown, the select transistor is also isolated from the memory cell transistor by the cell isolation groove in the column direction. After completion of the continuous RIE, the semiconductor wafer 11 is transferred to the load port of the RIE apparatus and stored in the closed-type transport container 60, which is transported via the transport rail 54 to the load port of the washer.

(o) From the closed-type transport container 60 transported to the load port of the washer, the semiconductor wafer 11 is transferred to the washing bath of the washer, and the resist mask 24 is removed. The semiconductor wafer 11 from which the resist mask 24 has been removed is transferred to the load port of the washer and stored in the closed-type transport container 60, which is transported via the transport rail 54 to the load port of the ion implantation apparatus.

Figure 28:
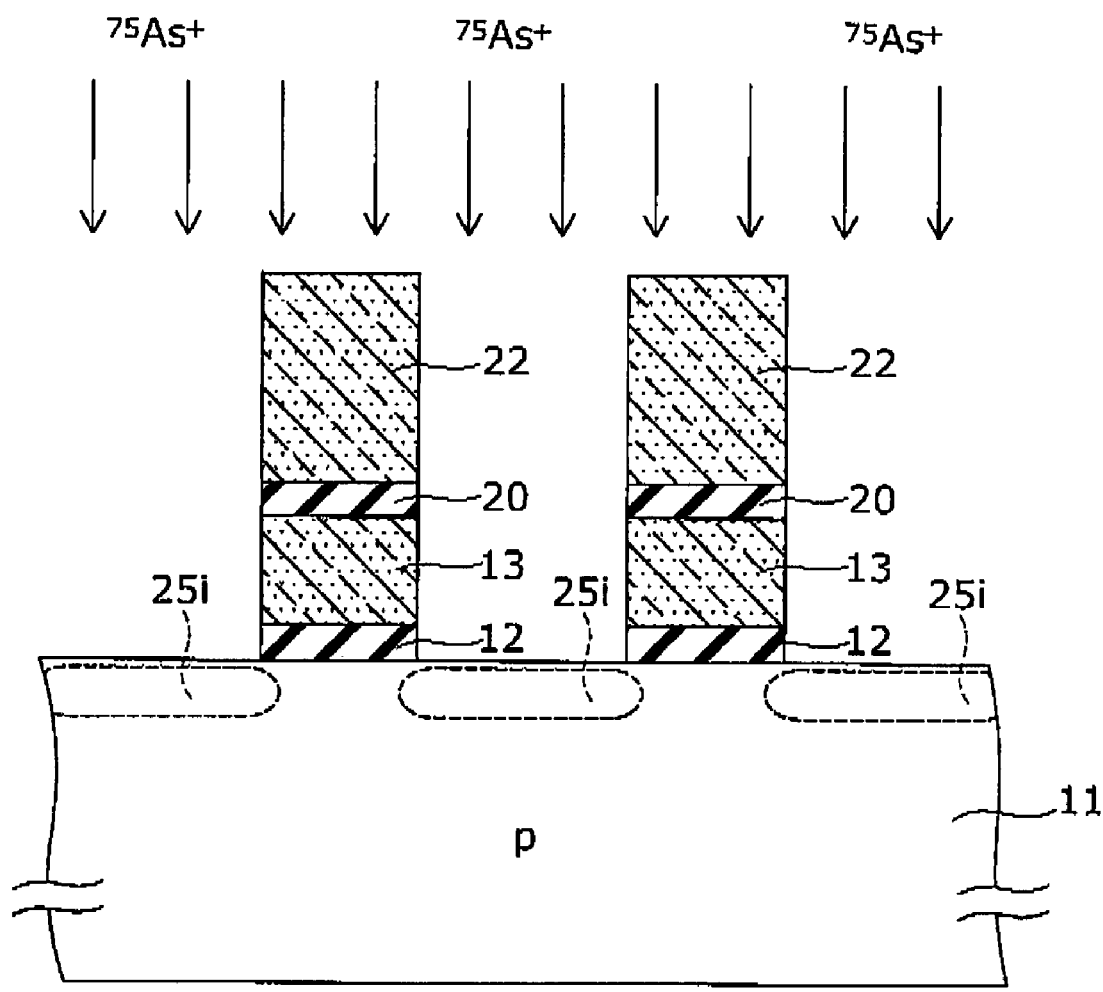

(p) From the closed-type transport container 60 transported to the load port of the ion implantation apparatus, the semiconductor wafer 11 is transferred to the ion implantation apparatus. As shown in FIG. 28, the laminated structure (12, 13, 20, 22) composed of the gate insulating film 12, the floating electrode 13, the interelectrode insulating film 20, and the control electrode 22 and isolated from each other by the cell isolation groove is used as a mask to implant n-type dopant ions such as arsenic ions ($^{75}As^+$) or phosphorus ions ($^{31}P^+$) into the semiconductor substrate 11 exposed to the cell isolation groove in a self-aligned manner. In FIG. 28, the ion implantation region 25$i$ in the non-activated state is indicated by the dashed line. The semiconductor wafer 11 doped with n-type dopant ions is transferred to the load port of the ion implantation apparatus and stored in the closed-type transport container 60, which is transported via the transport rail 54 to the load port of the annealing furnace.

Figure 29:
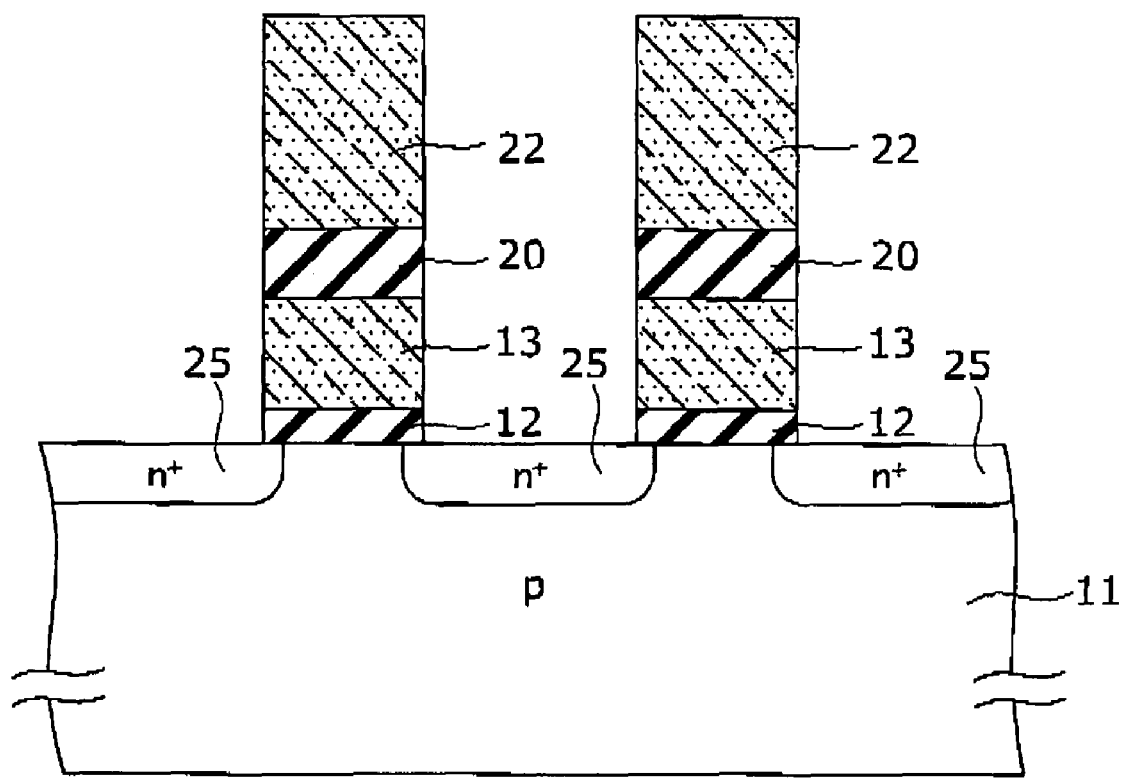

(q) From the closed-type transport container 60 transported to the load port of the annealing furnace, the semiconductor wafer 11 is transferred to the annealing furnace, and activation annealing following ion implantation is performed. As a result, as shown in FIG. 29, a source/drain region 25 is formed in the surface of the semiconductor substrate 11, and thereby each memory transistor is constructed. The semiconductor wafer 11 with the source/drain regions 25 formed therein is transferred to the load port of the annealing furnace and stored in the closed-type transport container 60, which is transported via the transport rail 54 to the load port of the interlayer insulating film CVD apparatus.

Figure 30:
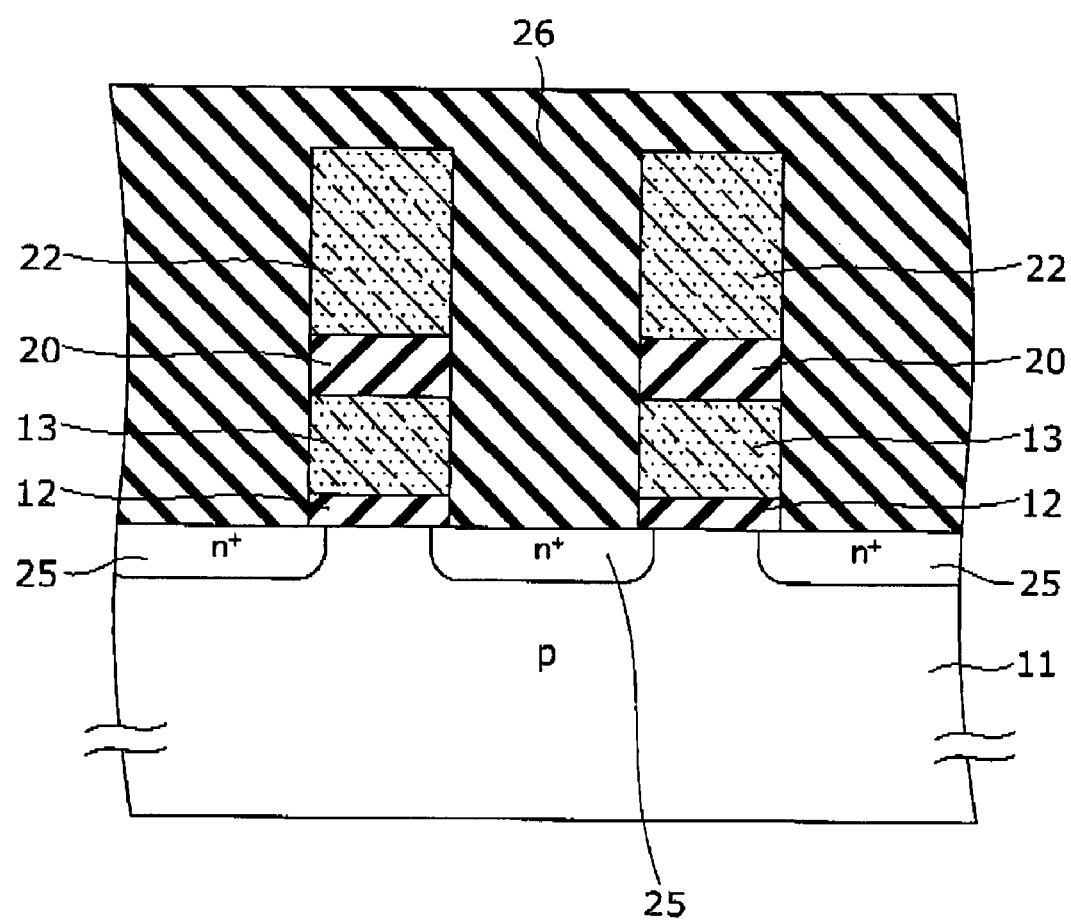

(r) From the closed-type transport container 60 transported to the load port of the interlayer insulating film CVD apparatus, the semiconductor wafer 11 is transferred to the chamber of the interlayer insulating film CVD apparatus. An SiOF film is deposited as an interlayer insulating film 26 by the HDP method using difluorofuran ($SiH_2F_2$) gas, for example. As a result, as shown in FIG. 30, the interlayer insulating film 26 is buried between each pair of memory cell transistors isolated from each other by the cell isolation groove and between the memory cell transistor and the select transistor (not shown). The semiconductor wafer 11 with the interlayer insulating film 26 deposited thereon is transferred to the load port of the interlayer insulating film CVD apparatus and stored in the closed-type transport container 60. The outlet/inlet of the valves 66$a$, 66$b$ are connected to the breathing filters 64$a$, 64$b$ of the closed-type transport container 60, and the inside of the closed-type transport container 60 is purged with inert gas for 5 to 180 minutes. After inert gas purge, the valves 66$a$, 66$b$ are closed, and the outlet/inlet of the valves 66$a$, 66$b$ are detached. The closed-type transport container 60 is transported via the transport rail 54 to the load port of the spinner.

(s) The process by the spinner, the subsequent process by the stepper, and the further subsequent process by the developing apparatus are similar to the above processes (k) to (m). A new photoresist film is applied on the entire surface, and then the new photoresist film is patterned using the conventional photolithography technique. The new photoresist film is used as an etching mask to open a via hole (contact hole) between the two select transistors by the RIE apparatus. The contact hole is filled with tungsten or other conductor by a sputtering apparatus, a vacuum evaporation apparatus, and a metal CVD apparatus to form a contact plug. Furthermore, a metal film (conductor film) is deposited by these sputtering apparatus, vacuum evaporation apparatus, and metal CVD apparatus. Then the metal film (conductor film) is patterned by the photolithography technique similar to that used in the above processes (k) to (m) and RIE similar to that used in the process (n) (or using the damascene technique) to form the interconnect of bit lines 27 on the interlayer insulating film 26 as shown in FIG. 16. Thus a semiconductor memory device according to the embodiment of the invention is completed. Although not shown in FIG. 16, as with conventional processes for manufacturing NAND nonvolatile semiconductor memory devices (flash memories), an insulating film such as silicon nitride film or polyimide film may be formed as a passivation film on the interconnect of bit lines 27.

In the method for manufacturing a semiconductor device according to the embodiment of the invention, the humidity inside the closed-type transport container 60 can be made lower than the ambient humidity. Hence it is possible to prevent the influence of $NH_3$ contamination on semiconductor wafers and closed-type transport containers that occurs during the transport associated with the process of applying a silazane perhydride polymer solution, the baking process following this applying process, and the oxidation process following this baking process. In particular, shape anomaly is eliminated in the fine pattern of the photoresist film in the photolithography process, the performance of which is otherwise degraded by basic compounds containing nitrogen atoms. Thus NAND nonvolatile semiconductor memory devices (flash memories) with high precision and quality can be manufactured at high manufacturing yield.

In the above method for manufacturing a semiconductor device, the humidity inside the closed-type transport container 60 is controlled for the interprocess transport path from the PSZ film deposition to the photolithography process and the interprocess transport paths during the photolithography process. However, the humidity inside the closed-type transport container 60 may be controlled for other interprocess transport paths. For example, if the humidity inside the closed-type transport container 60 is controlled in transporting semiconductor wafers with deposited PSZ film being exposed, $NH_3$ release from the PSZ film can be reduced, and $NH_3$ contamination of the closed-type transport container 60 can be prevented.

Other Embodiments

The embodiment of the invention has been described above. However, the description and drawings constituting part of this disclosure should not be understood as limiting the present invention, Various alternative embodiments, examples, and practical applications will be apparent to those skilled in the art from this disclosure.

In the method for manufacturing a semiconductor device described in the embodiment of the invention, "intermediate products" are illustrated as semiconductor wafers such as Si substrates. However, the intermediate products are not limited to semiconductor wafers, but insulator substrates may be used. Furthermore, the invention is not limited to semiconductor devices. It will be readily understood from the above description that the invention is also applicable to a method for manufacturing electronic devices such as liquid crystal devices, magnetic recording media, optical recording media, thin-film magnetic heads, superconducting devices, and acoustoelectric conversion devices.

The embodiment is described with reference to a NAND nonvolatile semiconductor memory device (flash memory), and a method for manufacturing the same is illustratively described. However, the invention is similarly applicable to AND or DINOR flash memories other then NAND flash memories, and further applicable to various other semiconductor memory devices such as DRAM and SRAM. Moreover, it is understood that the invention is also applicable to manufacturing various semiconductor devices such as logic integrated circuits.

In the foregoing description, a FOUP is used as a closed-type transport container. However, the closed-type transport container is not limited to the FOUP. For example, it may be a closed-type transport container for 200-mm wafers compliant with SEMI standards, called SMIF (Standard of Mechanical Interface) pod.

Thus it is understood that the present invention encompasses various embodiments not described herein. Therefore the scope of the invention is to be defined only by the elements recited in the accompanying claims, which are supported by the above description.

The invention claimed is:

1. A method for manufacturing an electronic device using a closed-type transport container, comprising:
controlling relative humidity inside the closed-type transport container to be lower than ambient relative humidity outside the closed-type transport container on a particular interprocess transport path in which an intermediate product stored in the closed-type transport container is transported from a first manufacturing process to a second manufacturing process, the first manufacturing process allowing basic compounds containing nitrogen atoms to be released from the intermediate product, and the second manufacturing process being a photolithography process with chemically-amplified photoresist.

2. The method for manufacturing an electronic device according to claim 1, wherein at least one of nitrogen gas, inert gas, dry air, desiccant, or electrolyte film is used as means for controlling relative humidity supplied through breathing filters provided at a bottom of the closed-type transport container.

3. The method for manufacturing an electronic device according to claim 1, wherein the relative humidity inside the closed-type transport container is controlled to 30% or less when the ambient relative humidity is 50%.

4. The method for manufacturing an electronic device according to claim 1, wherein the relative humidity inside the closed-type transport container is controlled to 10% or less when the ambient relative humidity is 50%.

5. The method for manufacturing an electronic device according to claim 1, wherein the relative humidity inside the closed-type transport container is controlled to 1% or less when the ambient relative humidity is 50%.

6. The method for manufacturing an electronic device according to claim 1, wherein the first manufacturing process is a process of applying a solution containing one of silazane perhydride and polysilazane.

7. The method for manufacturing an electronic device according to claim 1, wherein the basic compounds containing nitrogen atoms is $NH_3$.

8. The method for manufacturing an electronic device according to claim 1, wherein the basic compounds containing nitrogen atoms is an amine.

9. A method for manufacturing an electronic device using a closed-type transport container, comprising:
keeping a work in an atmosphere between a first manufacturing process and a second manufacturing process following the first manufacturing process when transporting the closed-type transport container from the first manufacturing process to the second manufacturing process, a relative humidity of the atmosphere being 30% or less, the first manufacturing process allowing compounds containing nitrogen and hydrogen to be released from the work, and the second manufacturing process being a photolithography process with chemically-amplified photoresist.

10. The method for manufacturing an electronic device according to claim 9, wherein the first manufacturing process includes forming an intermediate product on the work, the compounds containing nitrogen and hydrogen being allowed to be released from the intermediate product.

11. The method for manufacturing an electronic device according to claim 9, wherein the first manufacturing process includes a process where a gas including nitrogen and hydrogen is used.

12. The method for manufacturing an electronic device according to claim 11, wherein the first manufacturing process includes at least one of deposition and etching using the gas.

13. The method for manufacturing an electronic device according to claim 9, wherein the atmosphere is one of nitrogen gas, inert gas, air, and mixtures of any of these.

14. The method for manufacturing an electronic device according to claim 9, wherein the relative humidity is 10% or less.

15. The method for manufacturing an electronic device according to claim 9, wherein the relative humidity is 1% or less.

16. The method for manufacturing an electronic device according to claim 9, wherein the first manufacturing process includes a process of applying a solution containing one of silazane perhydride and polysilazane.

17. The method for manufacturing an electronic device according to claim 9, wherein the compound containing nitrogen and hydrogen is $NH_3$.

18. The method for manufacturing an electronic device according to claim 9, wherein the compound containing nitrogen and hydrogen is an amine.

* * * * *